(12) United States Patent
Lee et al.

(10) Patent No.: US 10,861,814 B2
(45) Date of Patent: Dec. 8, 2020

(54) INTEGRATED FAN-OUT PACKAGES AND METHODS OF FORMING THE SAME

(71) Applicant: Taiwan Semiconductor Manufacturing Co., Ltd., Hsinchu (TW)

(72) Inventors: Tzung-Hui Lee, New Taipei (TW); Chen-Hua Yu, Hsinchu (TW); Chi-Ming Tsai, New Taipei (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/965,981

(22) Filed: Apr. 30, 2018

(65) Prior Publication Data

US 2019/0131269 A1     May 2, 2019

Related U.S. Application Data

(60) Provisional application No. 62/580,451, filed on Nov. 2, 2017.

(51) Int. Cl.
*H01L 23/00* (2006.01)
*H01L 23/538* (2006.01)
(Continued)

(52) U.S. Cl.
CPC ............ *H01L 24/19* (2013.01); *H01L 21/481* (2013.01); *H01L 21/486* (2013.01); *H01L 21/4853* (2013.01); *H01L 21/56* (2013.01); *H01L 21/6835* (2013.01); *H01L 23/3128* (2013.01); *H01L 23/49811* (2013.01); *H01L 23/5389* (2013.01); *H01L 24/25* (2013.01);
(Continued)

(58) Field of Classification Search
None
See application file for complete search history.

(56) References Cited

U.S. PATENT DOCUMENTS 8,778,738 B1 * 7/2014 Lin .................. H01L 23/49838
438/118
9,000,584 B2    4/2015 Lin et al.
(Continued)

FOREIGN PATENT DOCUMENTS

| CN | 103545249 | 1/2014 |
|----|-----------|--------|
| CN | 104617056 | 5/2015 |
| CN | 106024751 | 10/2016 |

OTHER PUBLICATIONS

"Office Action of Taiwan Counterpart Application," dated Mar. 11, 2019, p. 1-p. 5.
(Continued)

*Primary Examiner* — Bilkis Jahan
(74) *Attorney, Agent, or Firm* — JCIPRNET

(57) ABSTRACT

Integrated fan-out packages and methods of forming the same are disclosed. An integrated fan-out package includes a bump structure, a polymer layer and a metal layer. The bump structure includes a metal pad and a bump electrically connected to the metal pad. The polymer layer extends laterally from a sidewall of the bump. The metal layer is over the bump structure and in physical contact with a side surface of the metal pad.

20 Claims, 25 Drawing Sheets

(51) Int. Cl.
*H01L 21/48* (2006.01)
*H01L 23/31* (2006.01)
*H01L 23/498* (2006.01)
*H01L 21/56* (2006.01)
*H01L 21/683* (2006.01)

(52) U.S. Cl.
CPC ............ *H01L 24/73* (2013.01); *H01L 21/568* (2013.01); *H01L 24/20* (2013.01); *H01L 24/24* (2013.01); *H01L 2221/68345* (2013.01); *H01L 2221/68359* (2013.01); *H01L 2221/68372* (2013.01); *H01L 2221/68381* (2013.01); *H01L 2224/18* (2013.01); *H01L 2224/215* (2013.01); *H01L 2224/24101* (2013.01); *H01L 2224/24227* (2013.01); *H01L 2224/25171* (2013.01); *H01L 2224/2919* (2013.01); *H01L 2224/32225* (2013.01); *H01L 2224/73209* (2013.01); *H01L 2224/73259* (2013.01); *H01L 2224/73267* (2013.01); *H01L 2224/83005* (2013.01); *H01L 2224/8385* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2006/0186537 A1* | 8/2006 | Goto ................. H01L 23/49827 257/734 |
| 2010/0133704 A1* | 6/2010 | Marimuthu ........... H01L 21/565 257/778 |
| 2010/0140752 A1* | 6/2010 | Marimuthu ......... H01L 23/3121 257/621 |
| 2011/0024916 A1 | 2/2011 | Marimuthu et al. | |
| 2011/0186874 A1* | 8/2011 | Shum ................. H01L 25/0753 257/88 |
| 2013/0292849 A1* | 11/2013 | Lin .................... H01L 21/76898 257/774 |
| 2016/0020172 A1* | 1/2016 | Su ..................... H01L 23/49822 257/530 |
| 2017/0207204 A1* | 7/2017 | Lin ......................... H01L 24/19 |
| 2017/0250138 A1 | 8/2017 | Hsieh et al. | |
| 2018/0005930 A1* | 1/2018 | Chiu ................... H01L 21/4846 |

OTHER PUBLICATIONS

"Office Action of Taiwan Counterpart Application," dated Sep. 20, 2019, p. 1-p. 5.

* cited by examiner

INTEGRATED FAN-OUT PACKAGES AND METHODS OF FORMING THE SAME

CROSS-REFERENCE TO RELATED APPLICATION

This application claims the priority benefit of U.S. provisional application Ser. No. 62/580,451, filed on Nov. 2, 2017. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of packages for semiconductors include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Currently, integrated fan-out packages are becoming increasingly popular for their compactness. However, there are many challenges related to integrated fan-out packages.

DETAILED DESCRIPTION

Figure 1A:
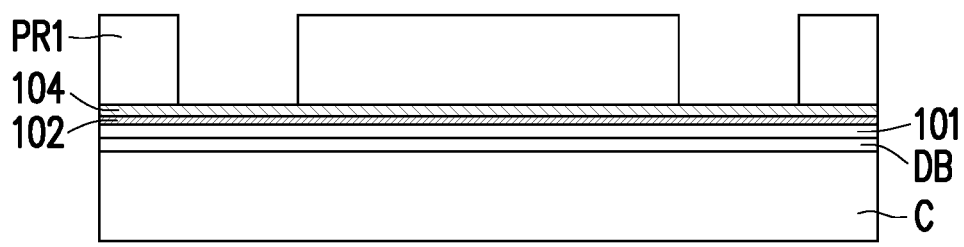
FIG. 1A to FIG. 1J are cross-sectional views of a method of forming an integrated fan-out package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1J are cross-sectional views of a method of forming an integrated fan-out package in accordance with some embodiments.

Referring to FIG. 1A, a polymer layer 101 is formed on a carrier C. In some embodiments, the carrier C has a de-bonding layer DB, and the polymer layer 101 is formed on the de-bonding layer DB. In some embodiments, the carrier C is a glass substrate, and the de-bonding layer DB is a light-to-heat conversion (LTHC) release layer formed on the glass substrate. The polymer layer 101 includes polybenzoxazole (PBO), polyimide (PI), benzocyclobutene (BCB), a combination thereof or the like.

Thereafter, an optional barrier layer 102 and a glue layer 104 are sequentially formed on the polymer layer 101. In some embodiments, the barrier layer 102 includes metal, such as Ti, W, Cr, TiW or a combination thereof, and can be formed by a sputtering or a suitable method. In some embodiments, the glue layer 104 includes metal such as gold or an alloy thereof, and can be formed by a sputtering or a suitable method.

Afterwards, a photoresist layer PR1 is formed on the glue layer 104. In some embodiments, the photoresist layer PR1 is a dry film resist (DFR) and has openings that expose the intended locations for the subsequently formed metal pads 109.

Figure 1B:
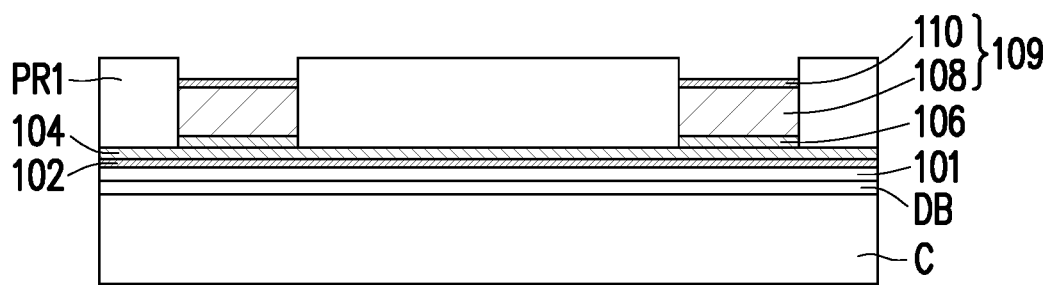

Referring to FIG. 1B, metal pads 109 are formed in the openings of the photoresist layer PR1. In some embodiments, the method of forming the metal pads 109 includes performing an electrochemical plating (ECP) process. In some embodiments, the metal pads 109 are plated in the openings by using the glue layer 104 as a seed layer. Specifically, the metal pads 109 are directly plated on the glue layer 104 without sputtering or plating a seed layer. In some embodiments, the glue layer 104 is referred to as a seed layer throughout the description.

In some embodiments, before the metal pads 109 are plated, an optional glue layer 106 can be plated in each of the openings, so as to improve the plating property of the subsequently formed metal pads 109. In some embodiments, the glue layer 106 and the glue layer 104 are made by the same material. In alternative embodiments, the glue layer 106 and the glue layer 104 include different materials.

In some embodiments, the metal pads 109 include nickel, copper or a combination thereof. In some embodiments, each of the metal pads 109 has a multi-layer structure including, for example, a metal layer 108 and an optional cap layer 110 over the metal layer 108. In some embodiments, the metal layer 108 includes nickel, and the cap layer 110 includes copper. However, the disclosure is not limited thereto. In alternative embodiments, the metal pads 109 are made by a single material, such as nickel or copper.

In some embodiments, for a multi-layer metal pad 109, the thickness of the metal layer 108 is about 3 to 10 times (e.g., 6 times) the thickness of the cap layer 110. In some embodiments, the thickness of the metal layer 108 is about 5 to 40 times (e.g., 30 times) the thickness of the underlying glue layer 104 or 106. In some embodiments, the thickness of the metal layer 108 is about 5 to 20 times (e.g., 10 times) the thickness of the underlying barrier layer 102.

Figure 1C:
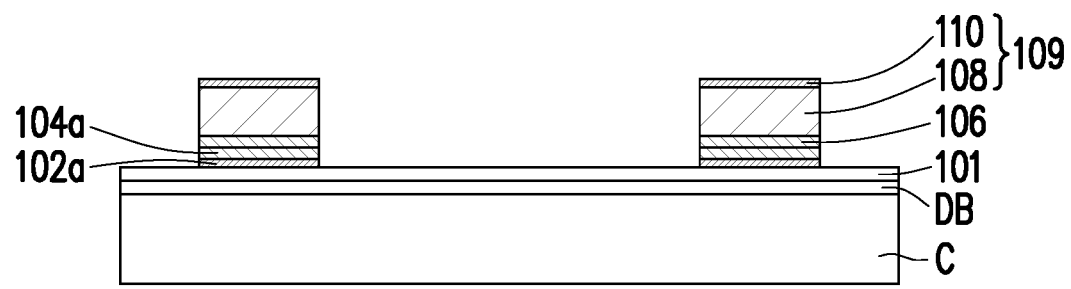

Referring to FIG. 1C, the photoresist layer PR1 and the underlying glue layer 104 and the barrier layer 102 are removed, and therefore, the remaining glue layer 104a and the barrier layer 102a are disposed below the corresponding metal pad 109.

Figure 1D:
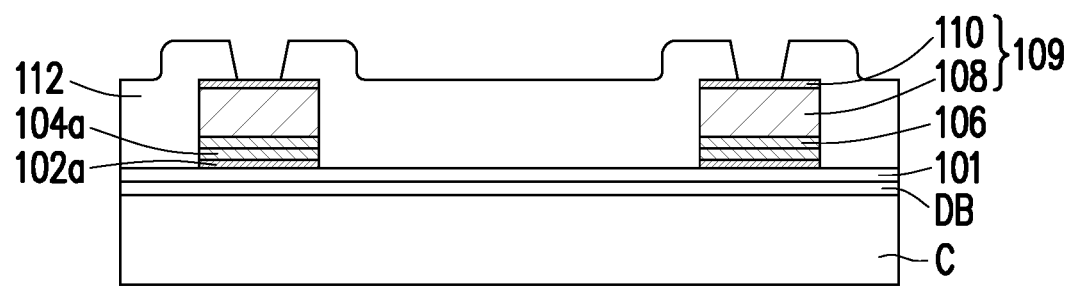

Referring to FIG. 1D, a polymer layer 112 is formed over the polymer layer 101. In some embodiments, the polymer layer 112 has openings that respectively expose portions of the top surfaces of the metal pads 109. In some embodiments, the polymer layer 112 includes polybenzoxazole (PBO), polyimide (PI), benzocyclobutene (BCB), a combination thereof or the like.

Figure 1E:
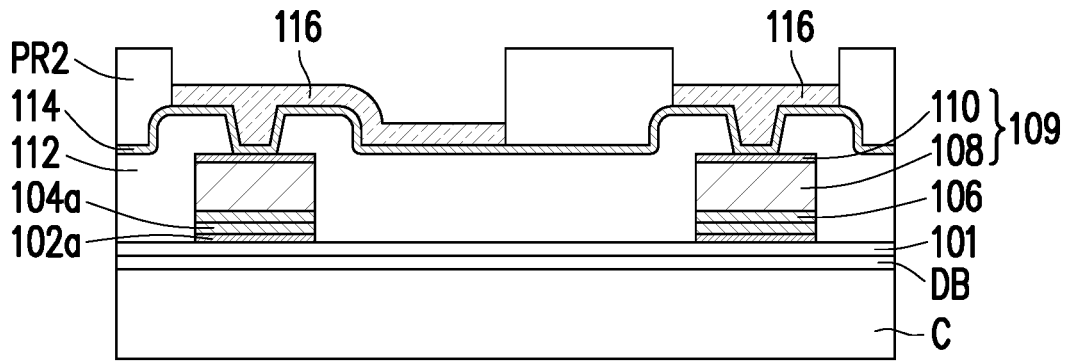

Referring to FIG. 1E, a seed layer 114 is formed on the entire surface of the polymer layer 122 and in physical contact with the exposed top surfaces of the metal pads 109. In some embodiments, the seed layer 114 is a titanium/copper composited layer, and is formed by a sputtering or a suitable method.

Thereafter, a photoresist layer PR2 is formed on the seed layer 114. In some embodiments, the photoresist layer PR2 is a dry film resist (DFR) and has openings that expose the intended locations for the subsequently formed redistribution layer. Afterwards, an electroplating process is performed to form a metal layer 116 (e.g., a copper layer) on the seed layer 114 exposed by the openings of the photoresist layer PR2.

Figure 1F:
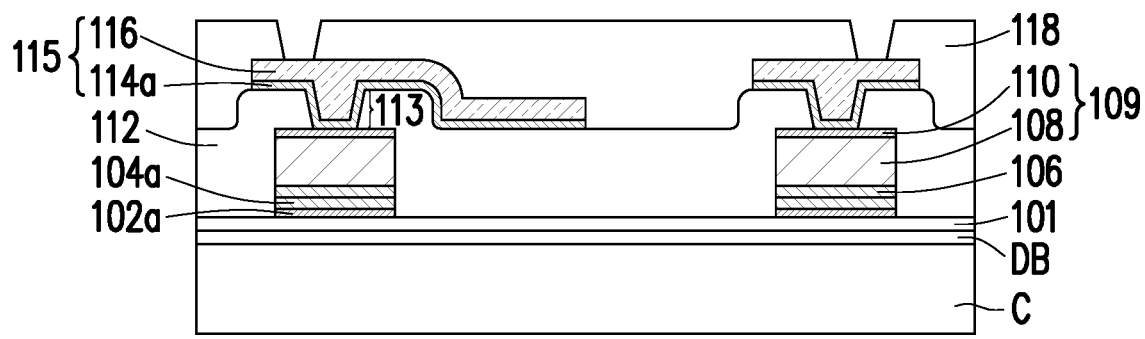

Referring to FIG. 1F, the photoresist layer PR2 and the underlying seed layer 114 are removed, and therefore, a first redistribution layer 115 is formed over and electrically connected to the metal pads 109 through the vias 113 thereof. In some embodiments, the first redistribution layer 115 includes a seed layer 114a and a metal layer 116 on the seed layer 114a. In some embodiments, the thickness of the metal layer 116 of the first redistribution layer 115 is about 0.5 to 5 times (e.g., 1.5-2.0 times) the thickness of the underlying metal layer 108 of each metal pad 109.

Thereafter, a polymer layer 118 is formed over the polymer layer 112. In some embodiments, the polymer layer 112 has openings that partially expose the top surface of the first redistribution layer 115. In some embodiments, the polymer layer 118 includes polybenzoxazole (PBO), polyimide (PI), benzocyclobutene (BCB), a combination thereof or the like.

In some embodiments, the first redistribution layer 115 and the polymer layer 118 constitute a first redistribution layer structure RDL1. In some embodiments, the first redistribution layer structure RDL1 is referred to as a backside redistribution layer structure throughout the description.

Figure 1G:
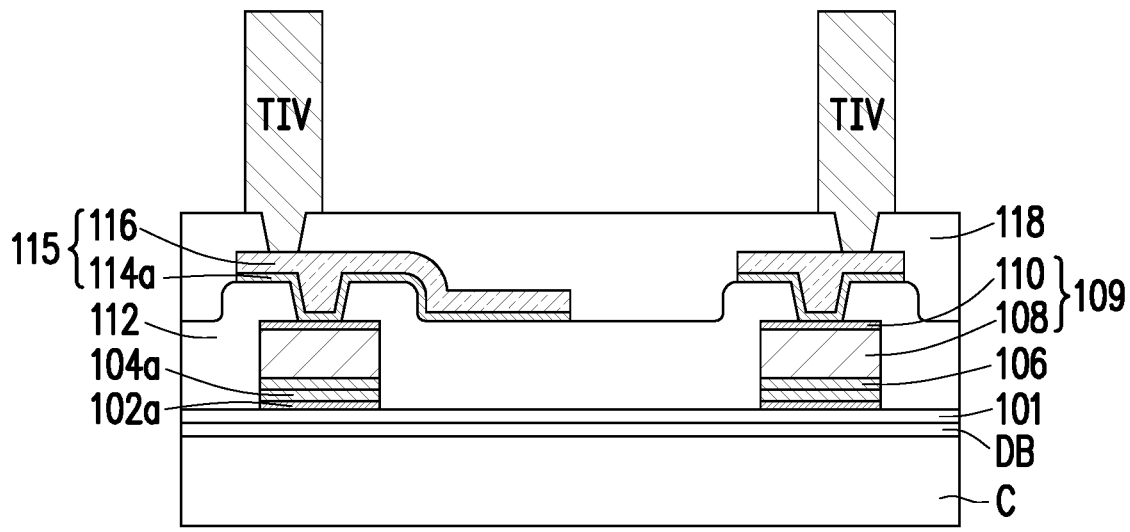

Referring to FIG. 1G, through integrated fan-out vias TIV are formed over and electrically connected to the first redistribution layer 115. In some embodiments, the through integrated fan-out vias TIV penetrate through the polymer layer 118 and are electrically connected to the first redistribution layer 115 and therefore the metal pads 109. In some embodiments, the through integrated fan-out vias TIV include copper and are formed by photolithography, plating, and photoresist stripping processes.

Figure 1H:
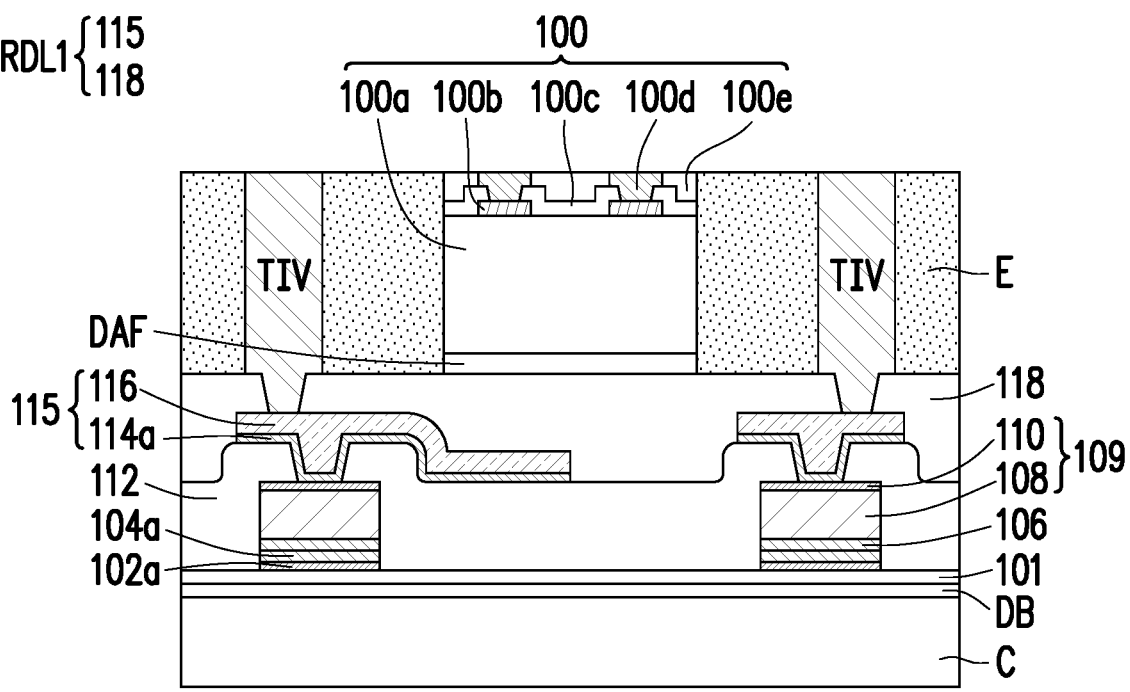

Referring to FIG. 1H, a semiconductor chip 100 is picked and placed on the carrier C such that the through integrated fan-out vias TIV are aside or around the semiconductor chip 100. In some embodiments, the semiconductor chip 100 has a substrate 100a, pads 100b over the substrate 100a, a passivation layer 100c over the substrate 100a and exposing portions of the pads 100b, connectors 100d over the passivation layer 100c and electrically connected to the pads 100b, and a protection layer 100e over the passivation layer 100c and aside the connectors 100d. In some embodiments, the side of the semiconductor chip 100 with the connectors 100d is referred to as a front side throughout the description. In some embodiments, a die attach film (DAF) is formed between the backside of the semiconductor chip 100 and the polymer layer 118.

Thereafter, an encapsulant E is formed over the carrier C aside the semiconductor chip 100 and the through integrated fan-out vias TIV. In some embodiments, the encapsulant E surrounds the semiconductor chip 100 and the through integrated fan-out vias TIV, and exposes the surfaces of the through integrated fan-out vias TIV and the connectors 100d. The encapsulant E includes a molding compound such as epoxy, a photo-sensitive material such as polybenzoxazole (PBO), polyimide (PI) or benzocyclobutene (BCB), a combination thereof or the like. The method of forming the encapsulant E includes forming an encapsulant material layer on the carrier C covering the semiconductor chip 100 and the through integrated fan-out vias TIV, and performing a grinding process to partially remove the encapsulant material layer.

Figure 1I:
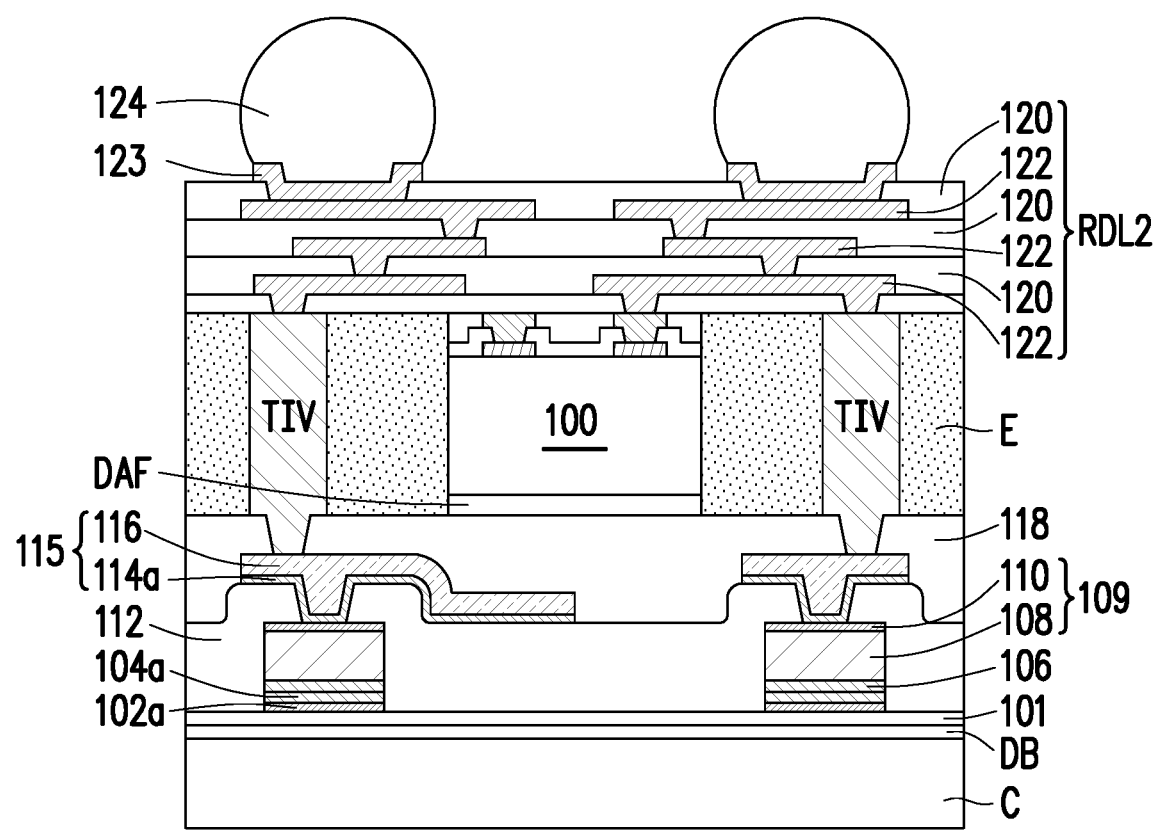

Referring to FIG. 1I, a second redistribution layer structure RDL2 is formed over and electrically connected to the semiconductor chip 100 and the through integrated fan-out vias TIV. In some embodiments, the second redistribution layer structure RDL2 is referred to as a front-side redistribution layer structure throughout the description.

In some embodiments, the redistribution layer structure RDL2 includes a plurality of polymer layers 120 and a plurality of second redistribution layers 122 stacked alternately. In some embodiments, each of the polymer layers 120 includes polybenzoxazole (PBO), polyimide (PI), benzocyclobutene (BCB), a combination thereof or the like. Each of the second redistribution layers 122 includes copper and is formed by photolithography, plating, and photoresist stripping processes.

Continue referring to FIG. 1I, under bump metallization (UBM) pads 123 are formed over and electrically connected to the second redistribution layer structure RDL2. Thereafter, bumps 124 are formed respectively on the UBM pads 123. In some embodiments, the bumps 124 are solder bumps and can be formed by a suitable process such as evaporation, electroplating, ball drop, or screen printing. In some embodiments, each of the bumps 124 can include, from bottom to top, a copper layer, a nickel layer, another copper layer and a solder bump. Other types of bump structures can be used upon the process requirements.

Figure 1J:
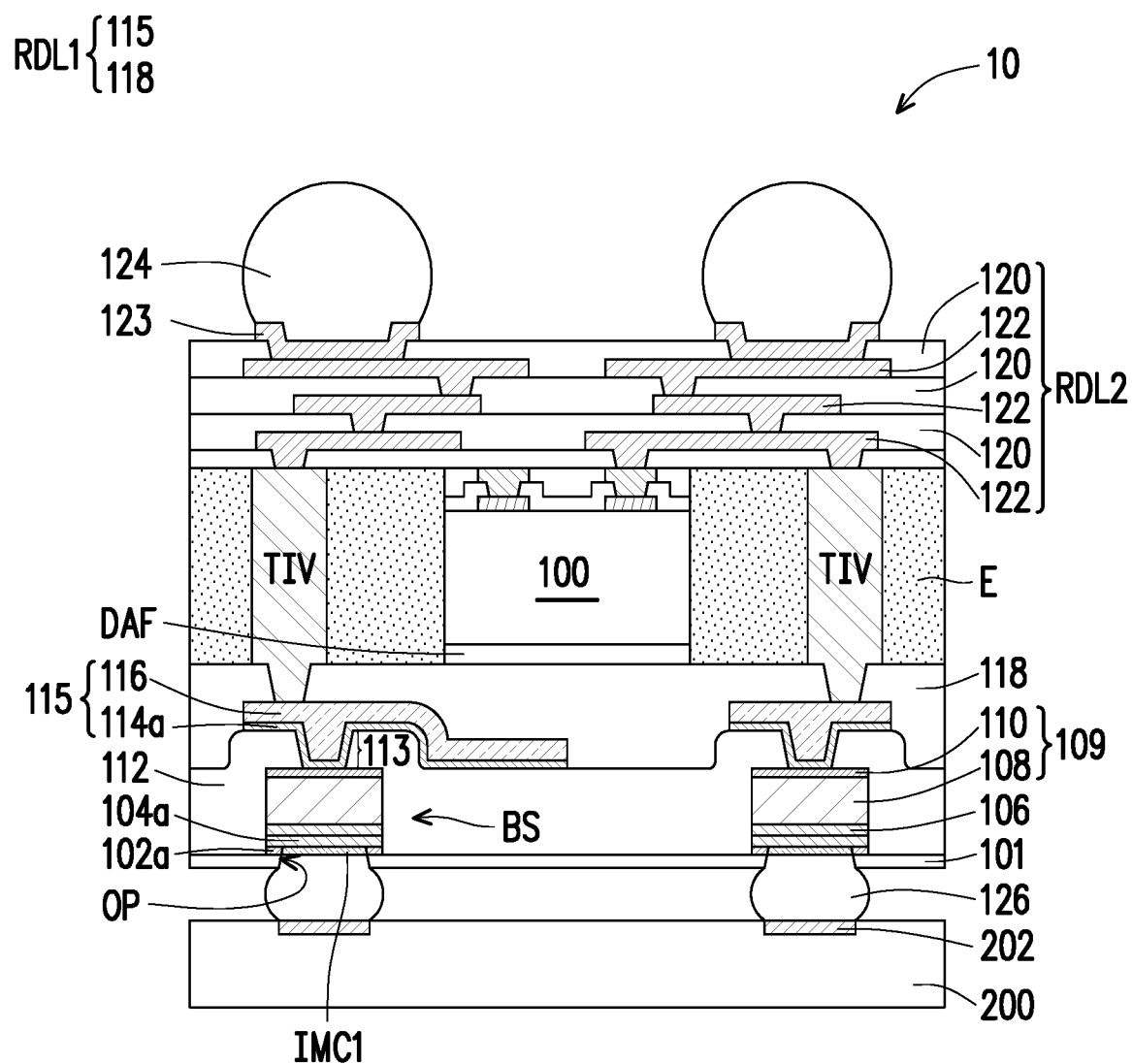

Referring to FIG. 1J, the carrier C is removed. In some embodiments, the de-bonding layer DB is decomposed under heat of light, and the carrier C is then de-bonded from the backside of the semiconductor chip 100.

Thereafter, the dielectric layer 101 is patterned such that openings OP are formed through the dielectric layer 101. In some embodiments, the openings OP of the dielectric layer 101 are formed by a laser drilling process and then a plasma clean process. In some embodiments, a portion of the barrier layer 102a is simultaneously removed during the pattering operation, and therefore, the bottom surface of the glue layer 104a is exposed. In some embodiments, the number of the openings OP correspond to the number of the through integrated fan-out vias TIV. Thereafter, bumps 126 are placed in the openings of the dielectric layer 101. In some embodiments, the bumps 126 are solder bumps and can be formed by a suitable process such as evaporation, electroplating, ball drop, or screen printing. During the thermal reflow process of the bump forming operation, intermetallic compound layers IMC1 are respectively formed between glue layers 104a and the bumps 126. In some embodiments, the intermetallic compound layers IMC1 include gold (Au). For example, the intermetallic compound layers IMC1 include an Au—Sn intermetallic compound layer. An integrated fan-out package 10 having dual-side terminals (e.g., bumps 124 and 126) is thus completed.

Afterwards, another package 200 is provided. In some embodiments, the package 200 includes a memory device or another suitable semiconductor device. The package 200 is electrically connected to the integrated fan-out package 10 through the pads 202 and bumps 126 such that a package-on-package (POP) structure is fabricated.

Although the integrated fan-out package 10 is described above, it will be understood that the disclosure is not limited to the structure since many modifications may be made both in the material and arrangement of elements. Some possible modifications of the structures are described in the following.

In some embodiments, an integrated fan-out package 10/11/12/13/14 includes a semiconductor chip 100, a bump structure BS and a first redistribution layer 115, as shown in FIG. 1J and FIGS. 2-5. The bump structure BS is electrically connected to the semiconductor chip 100 and includes a solder bump 126, a metal pad 109 (e.g., nickel pad) electrically connected to the solder bump 126, and an intermetallic compound layer IMC1/IMC2 between the solder bump 126 and the metal pad 109. The first redistribution layer 115 is between the bump structure BS and the semiconductor chip 100 and includes a seed layer 114a and a metal layer 116 connected to the seed layer 114a.

In some embodiments, a through integrated fan-out via TIV is further included in the integrated fan-out package 10/11/12/13/14, and the through integrated fan-out via TIV is electrically connected to the first redistribution layer 115 and therefore the metal pad 109. In some embodiments, a seed layer of the through integrated fan-out via TIV is in physical contact with the metal layer 116 of the first redistribution layer 115.

In some embodiments, the metal pad 109 of the bump structure BS is in physical with the seed layer 114a of the first redistribution layer 115. In some embodiments, the first redistribution layer 115 is in physical contact with a portion of the top surface of the cap layer 110 (e.g., copper layer) of the metal pad 109 through the vias 113 thereof, as shown in the integrated fan-out package 10 of FIG. 1J. In alternative embodiments, when the optional cap layer 110 is omitted from the method described above, the first redistribution layer 115 is formed to contact a portion of a top surface of the metal layer 108 (e.g., nickel layer) of the metal pad 109 through the vias 113 thereof, as shown in the integrated fan-out package 11 of FIG. 2.

Figure 2:
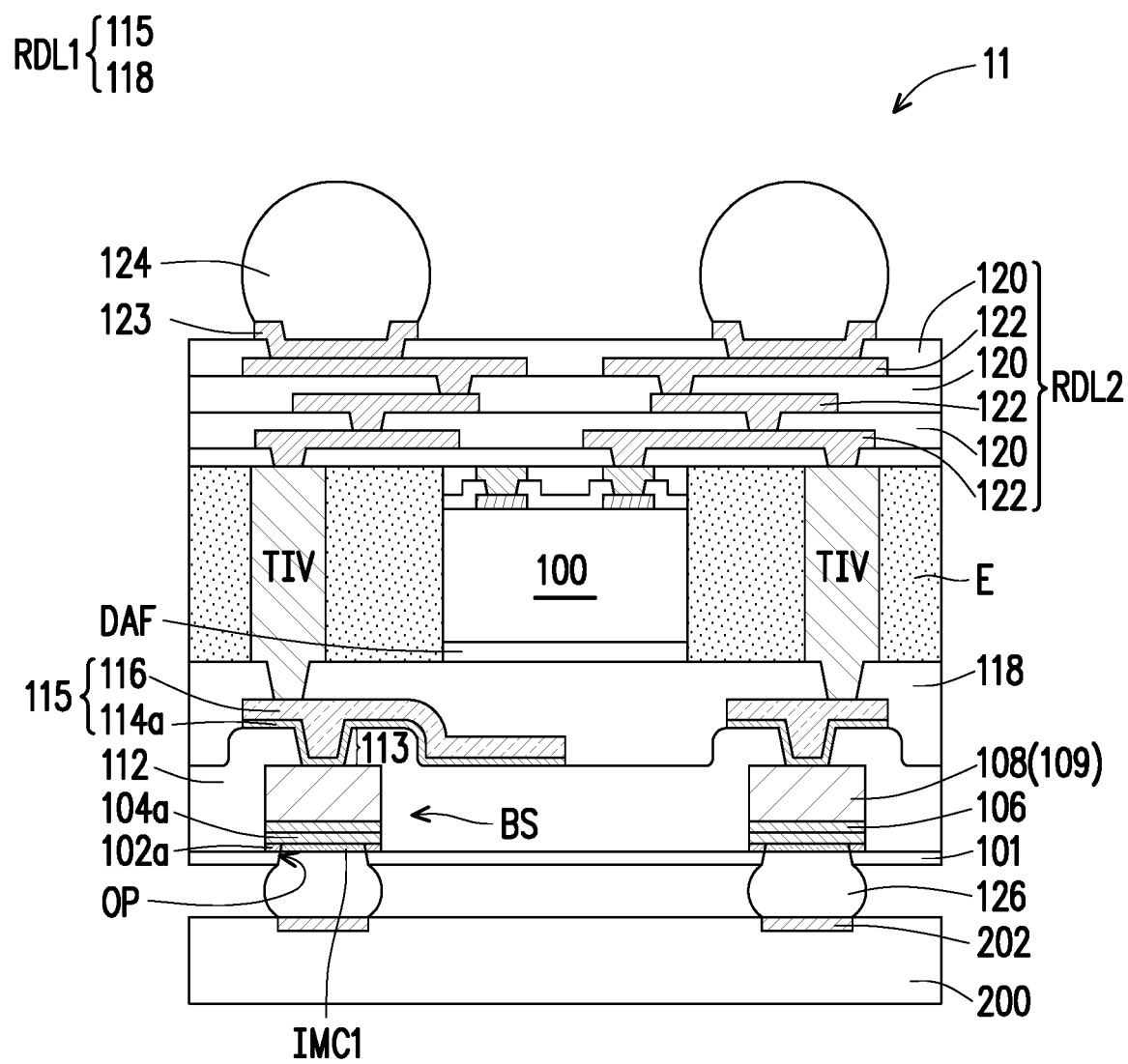
FIG. 2 to FIG. 5 are cross-sectional views of integrated fan-out packages in accordance with some embodiments.

In some embodiments, each bump structure BS further includes glue layers 106 and 104a, and the glue layers 106 and 104a are between the metal pad 109 and the intermetallic compound layer IMC1, as shown in the integrated fan-out package 10/11 of FIG. 1J and FIG. 2. In some embodiments, the intermetallic compound layer IMC1 is an Au—Sn intermetallic compound layer.

In some embodiments, a barrier layer 102a is further included and configured to be in physical contact with the intermetallic compound layer IMC1 and around the solder bump 126. The glue layers 106 and 104a include a material different from that of the barrier layer 102a. For example, the glue layers 106 and 104a include gold or an alloy thereof, and the barrier layer 102a includes Ti, W, Cr, TiW or a combination thereof. In some embodiments, the edge of the metal pad 109 is substantially aligned with the edges of the glue layer 104a and the barrier layer 102a.

Figure 3:
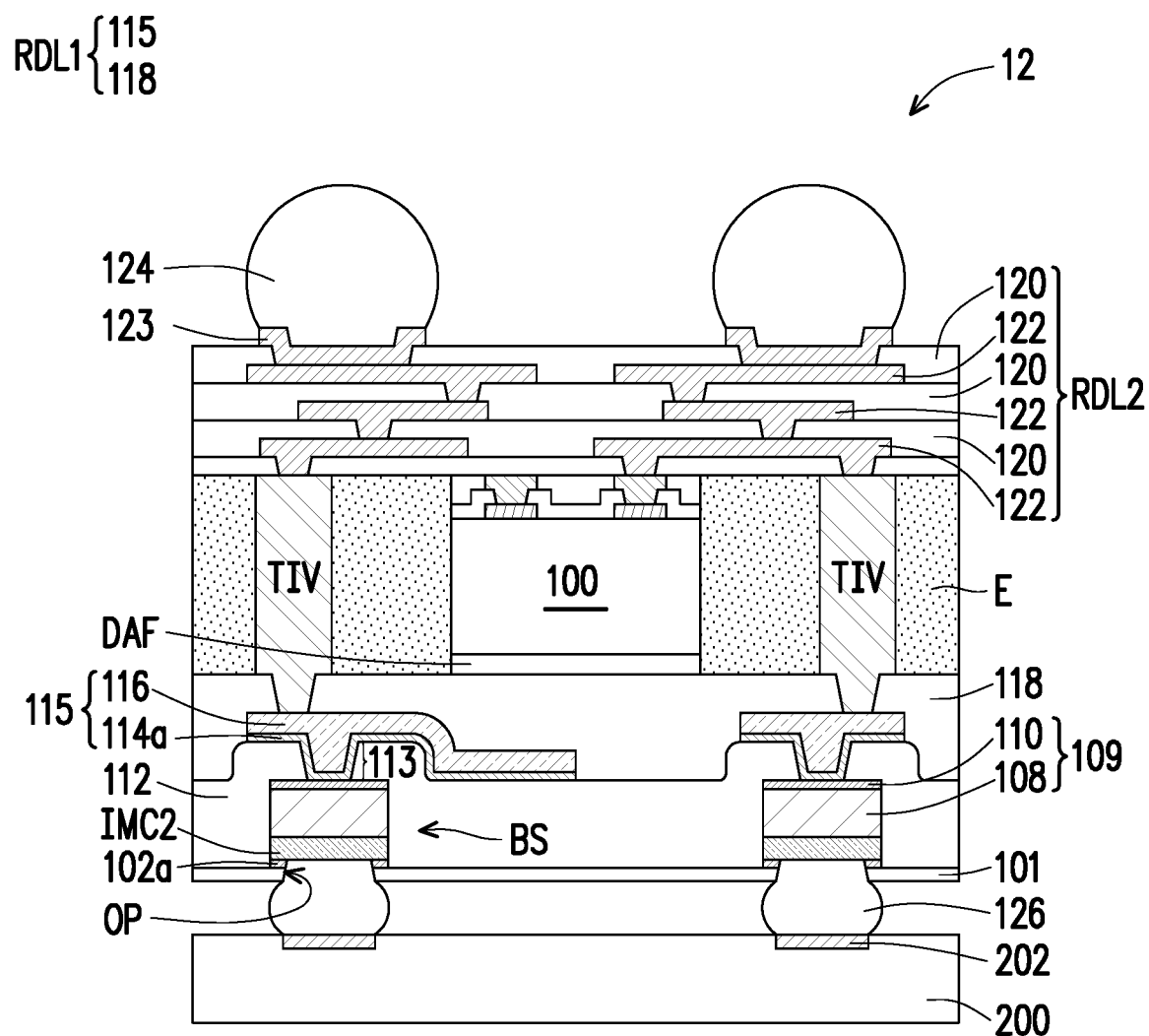

In some embodiments, as shown in FIG. 3, the solder bump 126 may completely consume the glue layers 104a and 106 (e.g., gold layers) and may react with gold and nickel to form an intermetallic compound layer IMC2 between the solder bump 126 and metal pad 109. In some embodiments, the intermetallic compound layer IMC2 is a Ni—Au—Sn intermetallic compound layer.

Figure 4:
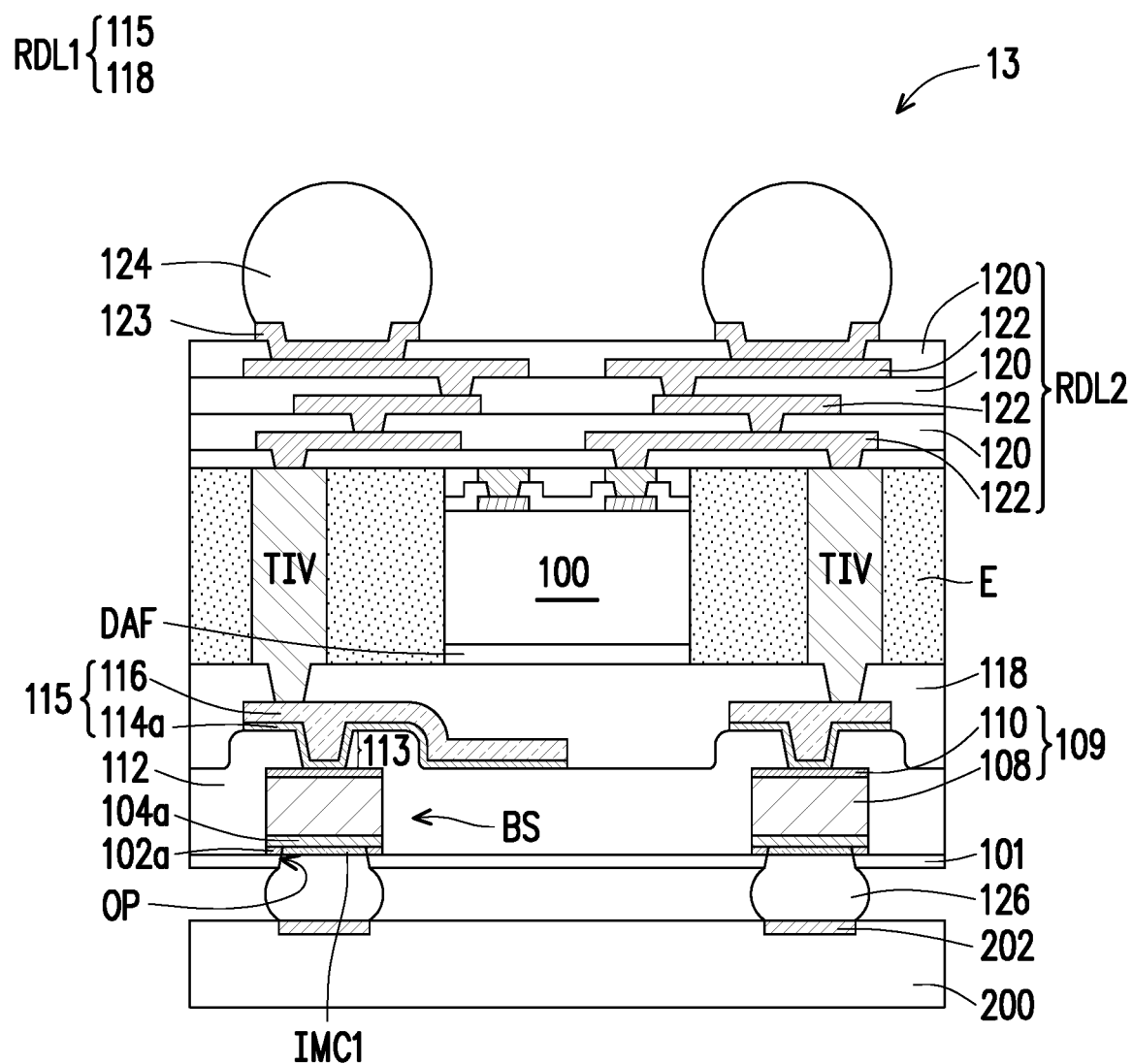
Figure 5:
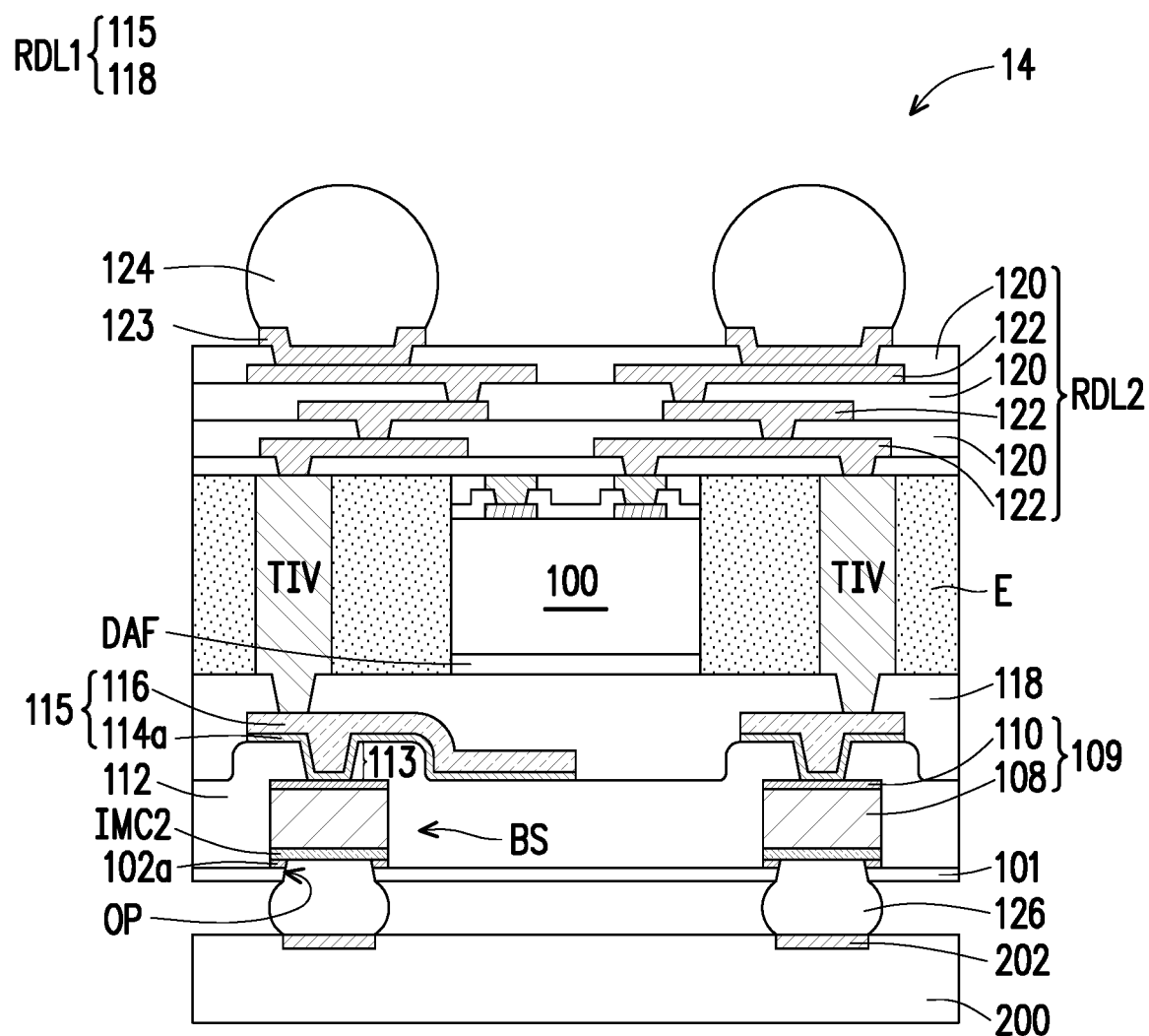

In some embodiments, the optional glue layer 106 is omitted from the method described above, so the metal layer 108 is plated directly on the sputtered glue layer 104a, as shown in the integrated fan-out package 13 of FIG. 4. In some embodiments, as shown in FIG. 5, the solder bump 126 may completely consume the glue layer 104a (e.g., gold layer) and may react with gold and nickel to form an intermetallic compound layer IMC2 between the solder bump 126 and metal pad 109.

In the present disclosure, a metal pad (e.g., Cu/Ni/Au or Ni/Au stack) is introduced between the solder bump and the backside redistribution layer, so the backside redistribution layer is not consumed by the solder bump, such as generation of the intermetallic compound (IMC), and thus, the reliability of the package is improved.

The above embodiments are directed to final package quality. The following embodiments are designed toward package quality and cost saving.

FIG. 6A to FIG. 6H are cross-sectional views of a method of forming an integrated fan-out package in accordance with alternative embodiments. The method of FIGS. 6A-6H is similar to method of FIGS. 1A-1J, and the difference between them lies in the formation and configuration of the backside redistribution layer. Like reference numerals will be used to represent like elements. The difference between them will be described in details below, and the similarity is not iterated herein.

Figure 6A:
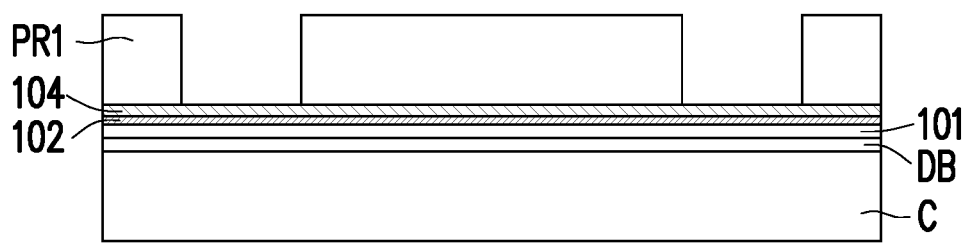
FIG. 6A to FIG. 6H are cross-sectional views of a method of forming an integrated fan-out package in accordance with alternative embodiments.

Referring to FIG. 6A, a carrier C is provided with a polymer layer 101 and a glue layer 104 formed thereon. In some embodiments, the carrier C has a de-bonding layer DB, and the polymer layer 101 is formed on the de-bonding layer DB. In some embodiments, an optional barrier layer 102 and a glue layer 104 are formed on the polymer layer 101. In some embodiments, the barrier layer 102 includes metal, such as Ti, W, Cr, TiW or a combination thereof, and can be formed by a sputtering or a suitable method. In some embodiments, the glue layer 104 includes metal such as gold or an alloy thereof, and can be formed by a sputtering or a suitable method.

Thereafter, a photoresist layer PR1 is formed on the glue layer 104. In some embodiments, the photoresist layer PR1 is a dry film resist (DFR) and has openings that expose the intended locations for the subsequently formed metal pads 109.

Figure 6B:
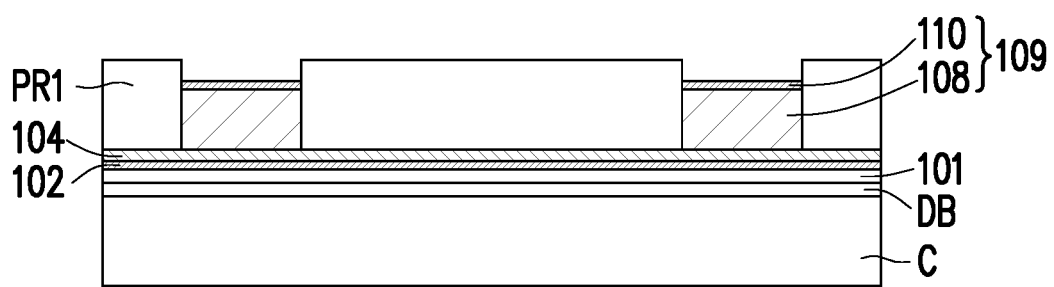

Referring to FIG. 6B, a plurality of metal pads 109 is plated on the carrier C by using the glue layer 104 as a seed layer. In some embodiments, the metal pads 109 are plated in the openings of the photoresist layer PR1 by using the sputtered glue layer 104 as a seed layer. Specifically, the metal pads 109 are directly plated on the glue layer 104 without sputtering or plating a seed layer.

In some embodiments, the metal pads 109 include nickel, copper or a combination thereof. In some embodiments, each of the metal pads 109 has a multi-layer structure including, for example, a metal layer 108 and an optional cap layer 110 over the metal layer 108. In some embodiments, the metal layer 108 includes nickel, and the cap layer 110 includes copper. However, the disclosure is not limited thereto. In alternative embodiments, the metal pads 109 are made by a single material, such as nickel or copper.

In some embodiments, the thickness of the nickel layer of each metal pad 109 is about 3 to 10 times (e.g., 6 times) the thickness of the optional cap layer 110. In some embodiments, the thickness of the nickel layer of each metal pad 109 is about 5 to 40 times (e.g., 30 times) the thickness of the underlying gold glue layer 104.

Figure 6C:
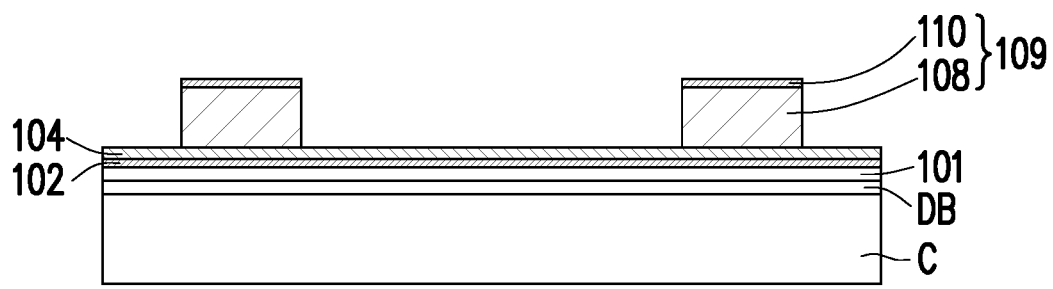
Figure 6D:
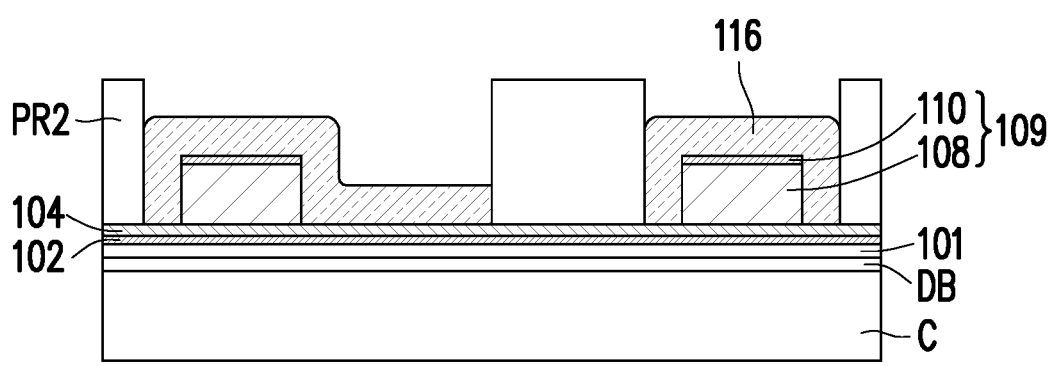
Figure 6E:
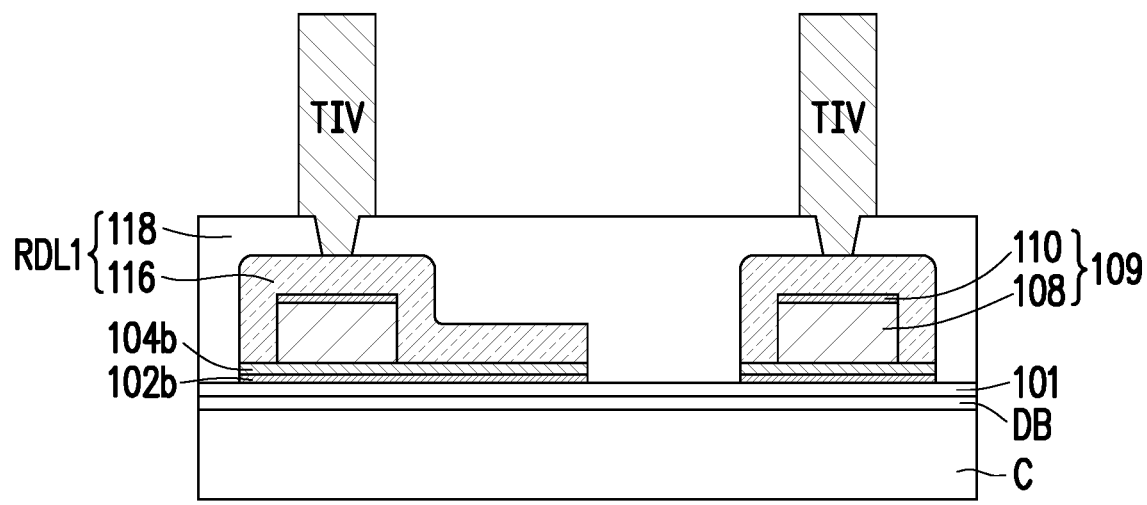

Referring to FIG. 6C to FIG. 6E, a metal layer 116 is plated on the metal pads 109 by using the same glue layer 104 as a seed layer. In some embodiments, the metal layer 116 is referred to as a backside redistribution layer throughout the description.

In some embodiments, as shown in FIG. 6C, the photoresist layer PR1 is removed (e.g., stripped) without removing the underlying glue layer 104 and the barrier layer 102. Thereafter, as shown in FIG. 6D, another photoresist layer PR2 is formed on the glue layer 104 after removing the photoresist layer PR1. In some embodiments, the photoresist layer PR2 is a dry film resist (DFR) and has openings that expose the intended locations for the subsequently formed redistribution layer. Afterwards, an electroplating process is performed to form a metal layer 116 (e.g., a copper layer) on the glue layer 104 exposed by the openings of the photoresist layer PR2. Specifically, the metal layer 116 is directly plated on the glue layer 104 without sputtering or plating a seed layer. In other words, the conventional Ti/Cu seed layer is not required during the operation of forming of the metal layer 116.

In some embodiments, the metal layer 116 is formed on the glue layer 104, covering or encapsulating the side surfaces and top surfaces of the metal pads 109. In some embodiments, the metal layer 116 is formed to contact the metal pads 109.

Thereafter, as shown in FIG. 6E, the photoresist layer PR2 and the underlying glue layer 104 and the barrier layer 102 are removed, and therefore, the remaining glue layer 104b and the barrier layer 102b are disposed below the first metal layer 116. A polymer layer 118 is then formed over the polymer layer 112. In some embodiments, the polymer layer 112 has openings that partially expose the top surface of the metal layer 116. In some embodiments, the metal layer 116 and the polymer layer 118 constitute a first redistribution layer structure RDL1. In some embodiments, the first redistribution layer structure RDL1 is referred to as a backside redistribution layer structure throughout the description.

Continue referring to FIG. 6E, a plurality of through integrated fan-out vias TIV is formed over and electrically connected to the redistribution layer (e.g., metal layer 116). In some embodiments, the through integrated fan-out vias TIV penetrate through the polymer layer 118 and are electrically connected to the metal layer 116 and therefore the metal pads 109.

Figure 6F:
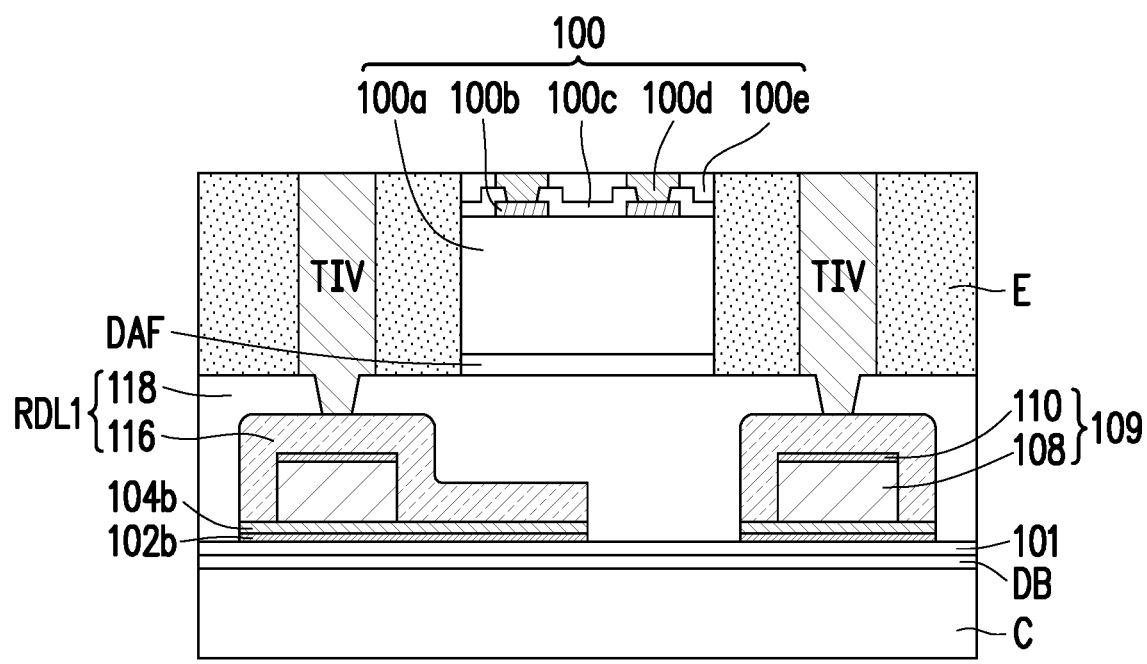

Referring to FIG. 6F, a semiconductor chip 100 is picked and placed on the carrier C such that the through integrated fan-out vias TIV are aside or around the semiconductor chip 100. Thereafter, an encapsulant E is formed over the carrier C aside the semiconductor chip 100 and the through integrated fan-out vias TIV.

Figure 6G:
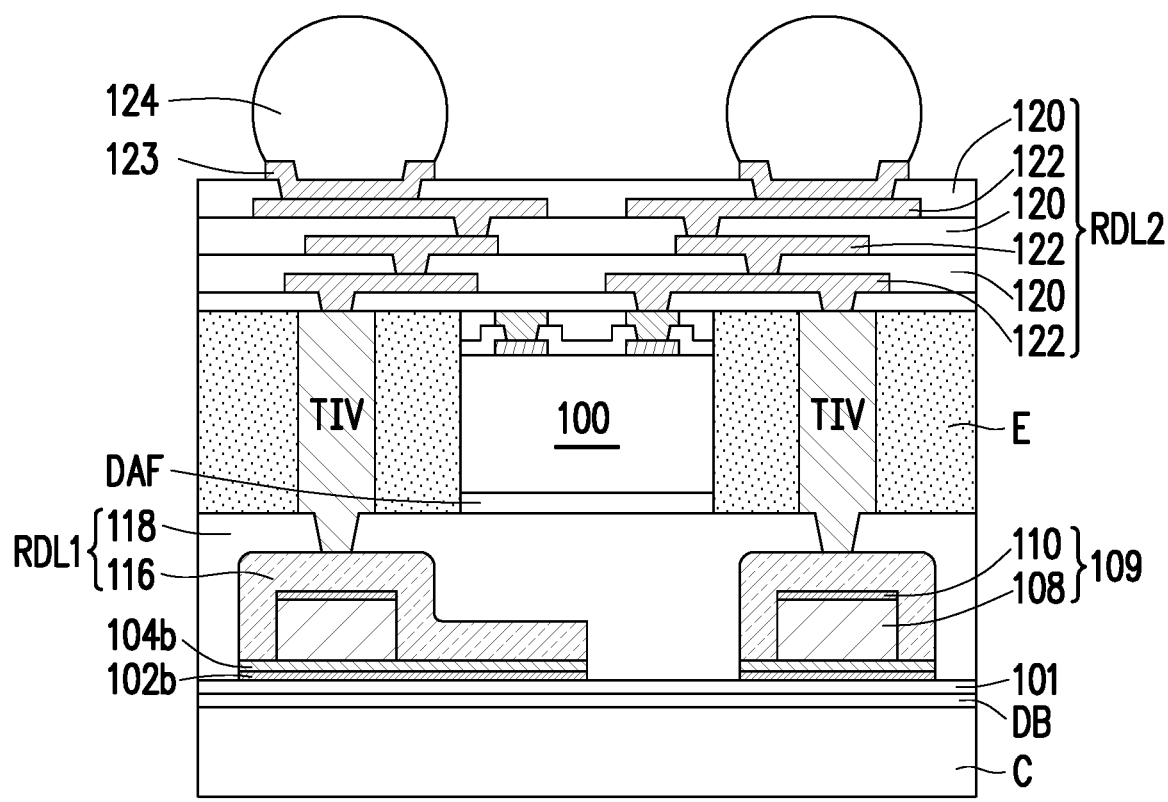

Referring to FIG. 6G, a second redistribution layer structure RDL2 is formed over and electrically connected to the semiconductor chip 100 and the through integrated fan-out vias TIV. In some embodiments, the second redistribution layer structure RDL2 is referred to as a front-side redistribution layer structure throughout the description. In some embodiments, the redistribution layer structure RDL2 includes polymer layers 120 and second redistribution layers 122 stacked alternately. Thereafter, under bump metallization (UBM) pads 123 are formed over and electrically connected to the second redistribution layer structure RDL2. Afterwards, bumps 124 are formed respectively on the UBM pads 123.

Figure 6H:
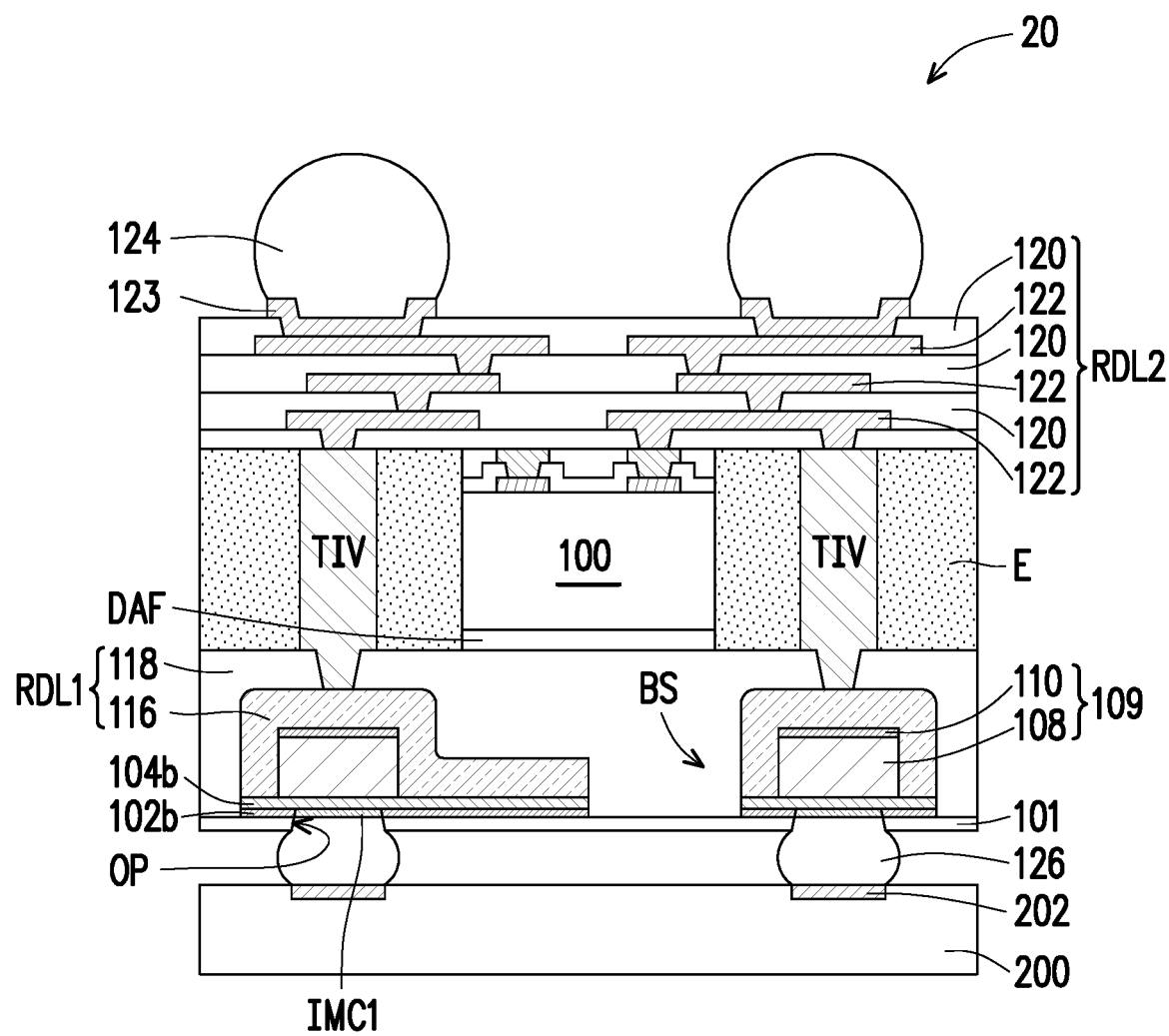

Referring to FIG. 6H, bumps 126 are formed through the polymer layer 101 and electrically connected to the metal pads 109. In some embodiments, the carrier C is removed, the dielectric layer 101 and the barrier layer 102b are then patterned to form openings OP therethrough, and the bumps 126 are placed in the openings OP. During the thermal reflow process of the bump forming operation, intermetallic compound layers IMC1 are respectively formed between glue layers 104b and the bumps 126. In some embodiments, the intermetallic compound layers IMC1 include gold (Au). For example, the intermetallic compound layers IMC1 include an Au—Sn intermetallic compound layer. An integrated fan-out package 20 having dual-side terminals (e.g., bumps 124 and 126) is thus completed.

Afterwards, another package 200 is provided and bonded o the integrated fan-out package 20 through the pads 202 and bumps 126 such that a package-on-package (POP) structure is fabricated.

Although the integrated fan-out package 20 is described above, it will be understood that the disclosure is not limited to the structure since many modifications may be made both in the material and arrangement of elements. Some possible modifications of the structures are described in the following.

In some embodiments, an integrated fan-out package 20/21/22/23/24 includes a bump structure BS, a polymer layer 101 and a metal layer 116, as shown in FIG. 6H and FIGS. 7-10. The bumps structure BS includes a metal pad 109 and a bump 126 electrically connected to the metal pad 109. The polymer layer 101 extends laterally from the sidewall of the bump 126. The metal layer 116 is over the bump structure BS and in physical contact with the side surface of the metal pad 109. In some embodiments, the metal layer 116 encapsulates the side surface and the top surface of the metal pad 109.

In some embodiments, a through integrated fan-out via TIV is further included in the integrated fan-out package 20/21/22/23/24, and the through integrated fan-out via TIV is electrically connected to the metal layer 116 and therefore the metal pad 109. In some embodiments, a seed layer of the through integrated fan-out via TIV is in physical contact with the metal layer 116.

In some embodiments, the metal pad 109 includes nickel, copper or a combination thereof. For example, the metal pad 109 includes a metal layer 108 (e.g., nickel layer) and an optional cap layer 110 (e.g., copper layer) over the metal layer 108. In some embodiments, the metal layer 116 is in physical contact with the metal layer 108 and the cap layer 110, as shown in the integrated fan-out package 20 of FIG. 6H. In alternative embodiments, when the optional cap layer 110 is omitted from the method described above, the metal layer 116 is formed to contact the metal layer 108 of the metal pad 109, as shown in the integrated fan-out package 21 of FIG. 7.

In some embodiments, the bump structure BS further includes an intermetallic compound layer IMC1/IMC2 between the metal pad 109 and the bump 126, and the intermetallic compound layer includes gold (Au).

Figure 7:
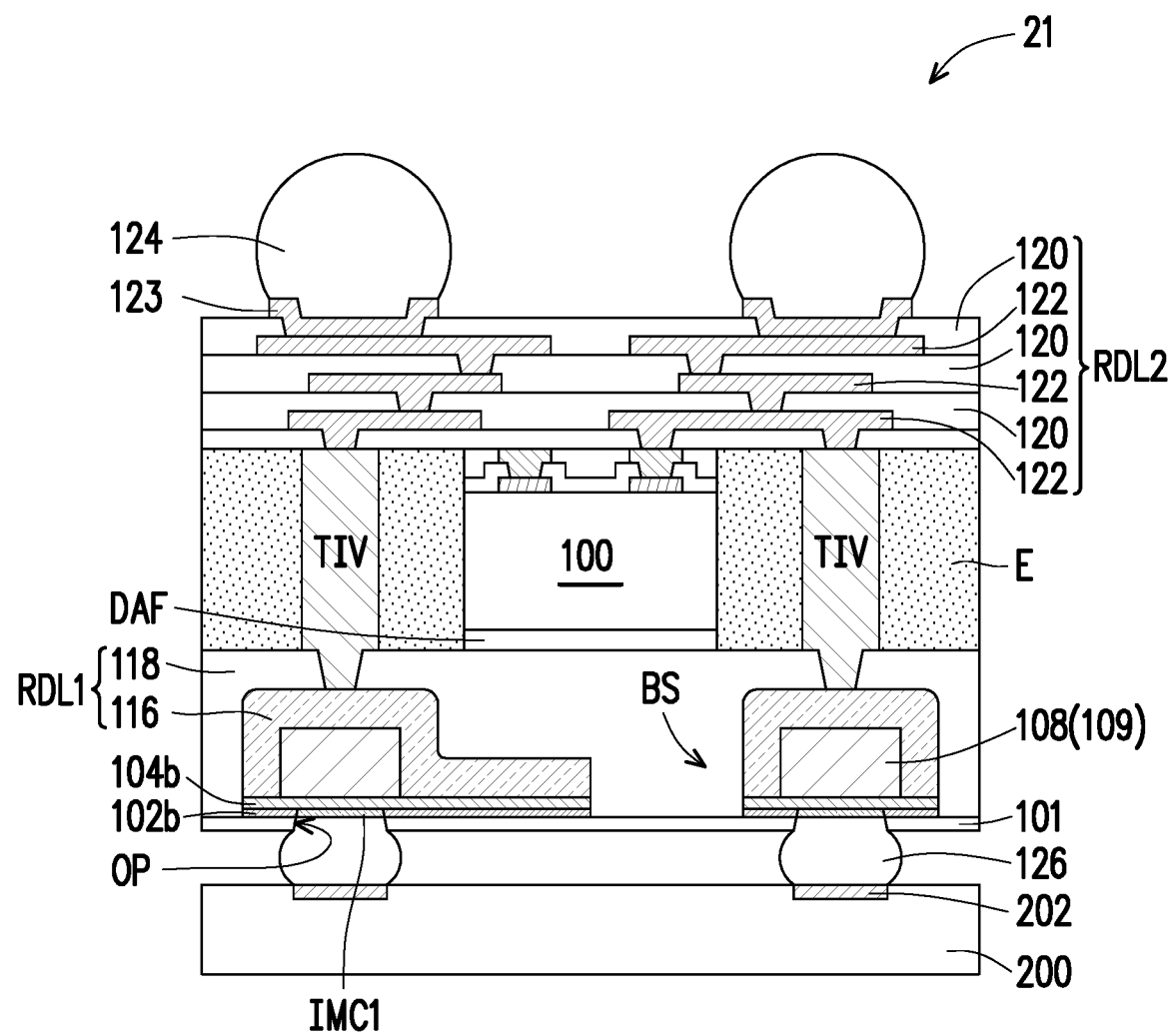
FIG. 7 to FIG. 10 are cross-sectional views of integrated fan-out packages in accordance with alternative embodiments.

In some embodiments, each bump structure BS further includes a glue layer 104b, and the glue layer 104b is between the metal pad 109 and the intermetallic compound layer IMC1 and between the polymer layer 101 and the metal layer 116, as shown in the integrated fan-out package 20/21 of FIG. 6H and FIG. 7. In some embodiments, the intermetallic compound layer IMC1 is an Au—Sn intermetallic compound layer.

In some embodiments, a barrier layer 102b is further included between the glue layer 104b and the polymer layer 101 and around the bump 126. The glue layer 104b and the barrier layer 102b include different materials. For example, the glue layer 104b includes gold or an alloy thereof, and the barrier layer 102b includes Ti, W, Cr, TiW or a combination thereof. In some embodiments, the edge of the metal layer 116 is substantially aligned with the edges of the glue layer 104b and the barrier layer 102b.

Figure 8:
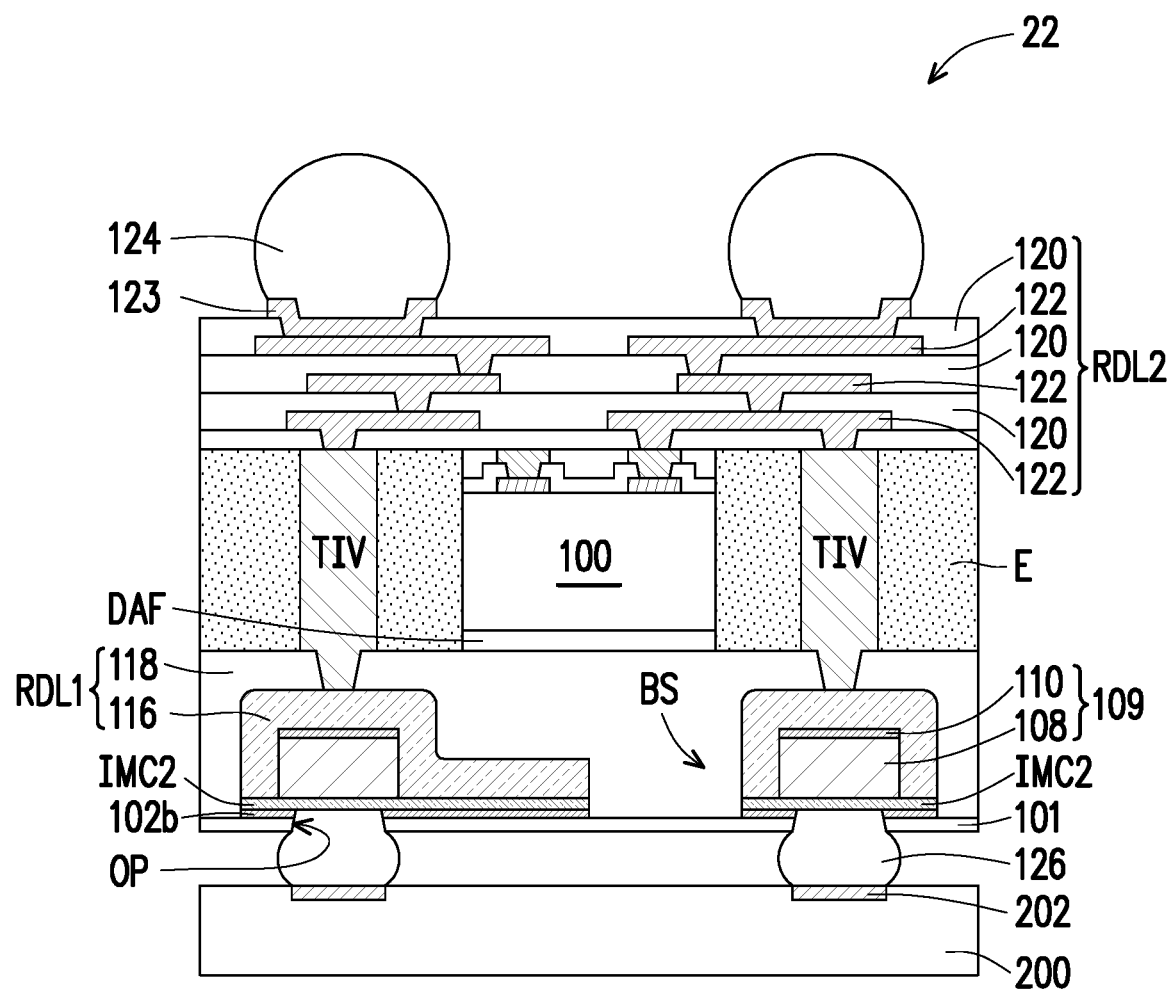

In some embodiments, as shown in FIG. 8, the solder bump 126 may completely consume the glue layer 104b (e.g., gold layer) and may react with gold and nickel (or copper) to form an intermetallic compound layer IMC2 between the solder bump 126 and metal pad 109. In some embodiments, the intermetallic compound layer IMC2 further extends between the metal layer 116 and the polymer layer 101. In some embodiments, the intermetallic compound layer IMC2 includes a Ni—Au—Sn intermetallic compound layer, a Cu—Au—Sn intermetallic compound layer or both. Specifically, the portion of the intermetallic compound layer IMC2 between the metal pad 109 and the solder bump 126 is a Ni—Au—Sn intermetallic compound layer, while another portion of the intermetallic compound layer IMC2 between the metal layer 116 and the polymer layer 101 is a Cu—Au—Sn intermetallic compound layer. In some embodiments, a barrier layer 102b is further included between the intermetallic compound layer IMC2 and the polymer layer 101 and around the solder bump 126.

Figure 9:
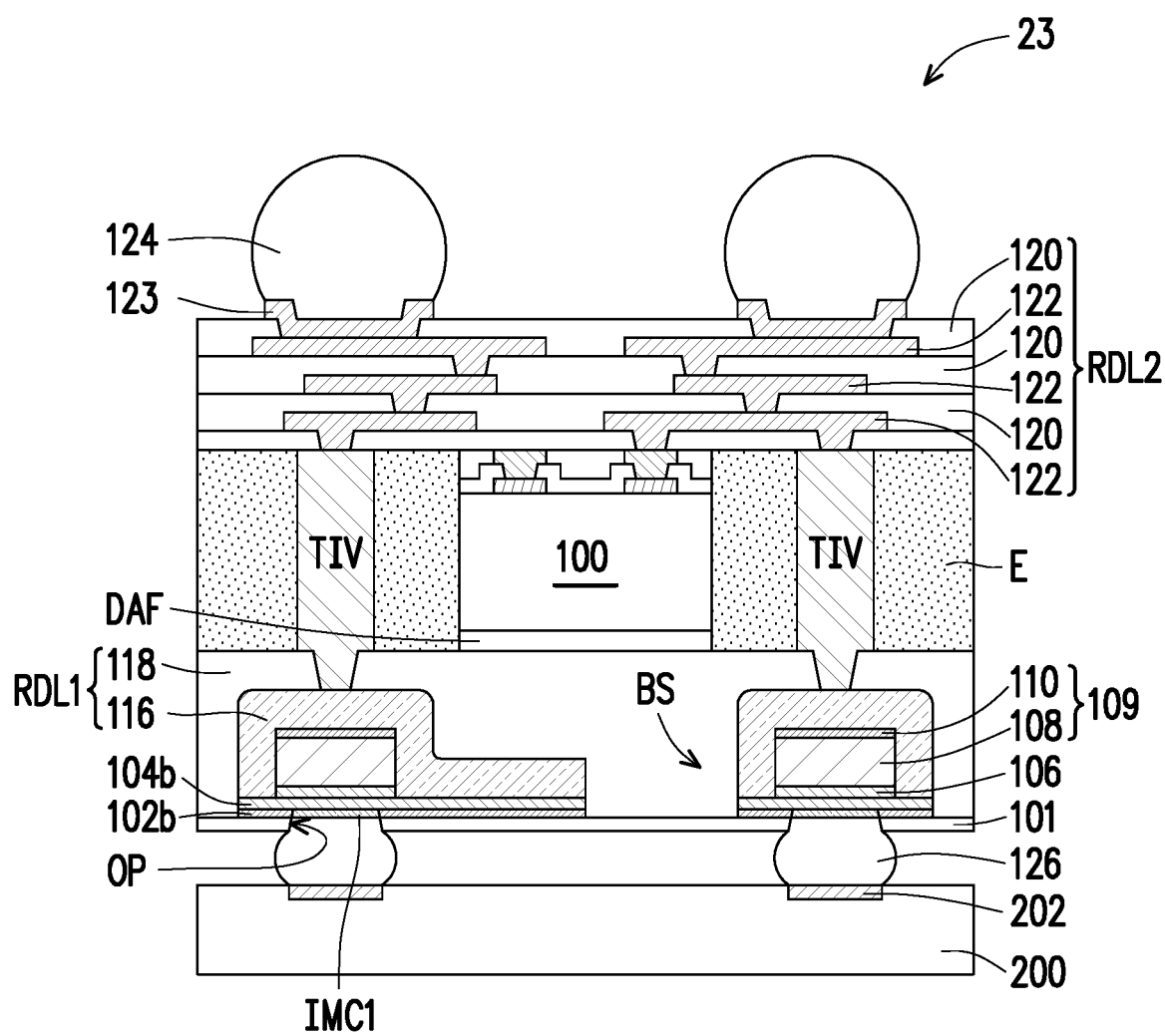

In some embodiments, the formation of an optional glue layer 106 is further included in the method described above, and the metal layer 108 is plated on the glue layer 106 by using the glue layer 106 as a seed layer, as shown in the integrated fan-out package 23 of FIG. 9. Specifically, the glue layer is thicker between the metal pad 109 and the bump 126 while thinner between the polymer layer 101 and the metal layer 116. In some embodiments, the thickness of the metal layer 108 of the metal pad 109 is about 5 to 30 times (e.g., 15 times) the thickness of the underlying glue layer 106, and is about 5 to 40 times (e.g., 30 times) the thickness of the underlying glue layer 104b.

Figure 10:
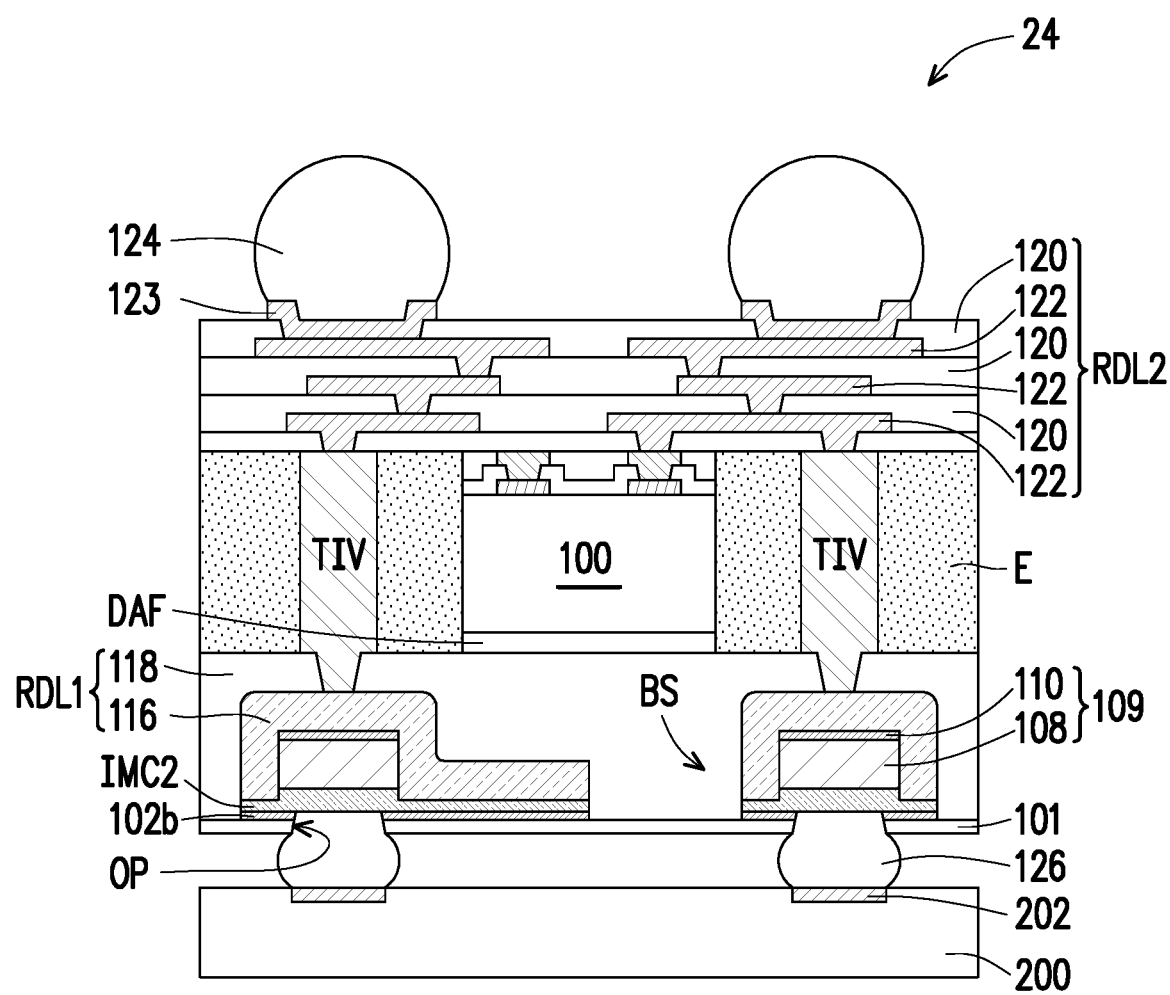

In some embodiments, as shown in FIG. 10, the solder bump 126 may completely consume the glue layers 104a and 106 (e.g., gold layers) and may react with gold and nickel (or copper) to form an intermetallic compound layer IMC2 between the solder bump 126 and metal pad 109. In some embodiments, the intermetallic compound layer IMC2 further extends between the metal layer 116 and the polymer layer 101. In some embodiments, the intermetallic compound layer IMC2 includes a Ni—Au—Sn intermetallic compound layer, a Cu—Au—Sn intermetallic compound layer or both.

The above embodiments in which metal pads are formed prior to the formation of a redistribution layer are provided for illustrations purposes, and are not construed as limiting the disclosure. In some embodiments, metal pads can be formed after the formation of a redistribution layer upon the process requirements.

FIG. 11A to FIG. 11F are cross-sectional views of a method of forming an integrated fan-out package in accordance with yet alternative embodiments. The method of FIGS. 11A-11F is similar to method of FIGS. 1A-1J, and the difference between them lies in the forming sequence of metal pads and the redistribution layer. Like reference numerals will be used to represent like elements. The difference between them will be described in details below, and the similarity is not iterated herein.

Figure 11A:
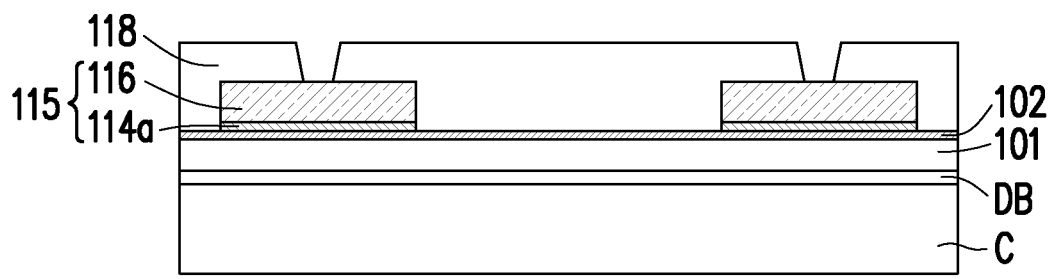
FIG. 11A to FIG. 11F are cross-sectional views of a method of forming an integrated fan-out package in accordance with yet alternative embodiments.

Referring to FIG. 11A, a carrier C is provided with a polymer layer 101 formed thereon. In some embodiments, the carrier C has a de-bonding layer DB, and the polymer layer 101 is formed on the de-bonding layer DB. In some embodiments, an optional barrier layer 102 is formed on the polymer layer 101. In some embodiments, the barrier layer 102 includes metal, such as Ti, W, Cr, TiW or a combination thereof, and can be formed by a sputtering or a suitable method.

Thereafter, a first redistribution layer 115 is formed on the barrier layer 102. In some embodiments, the first redistribution layer 115 includes a seed layer 114a and a metal layer 116 on the seed layer 114a. Afterwards, a polymer layer 118 is formed over the polymer layer 112. In some embodiments, the first redistribution layer 115 and the polymer layer 118 constitute a first redistribution layer structure RDL1. In some embodiments, the first redistribution layer structure RDL1 is referred to as a backside redistribution layer structure throughout the description.

Figure 11B:
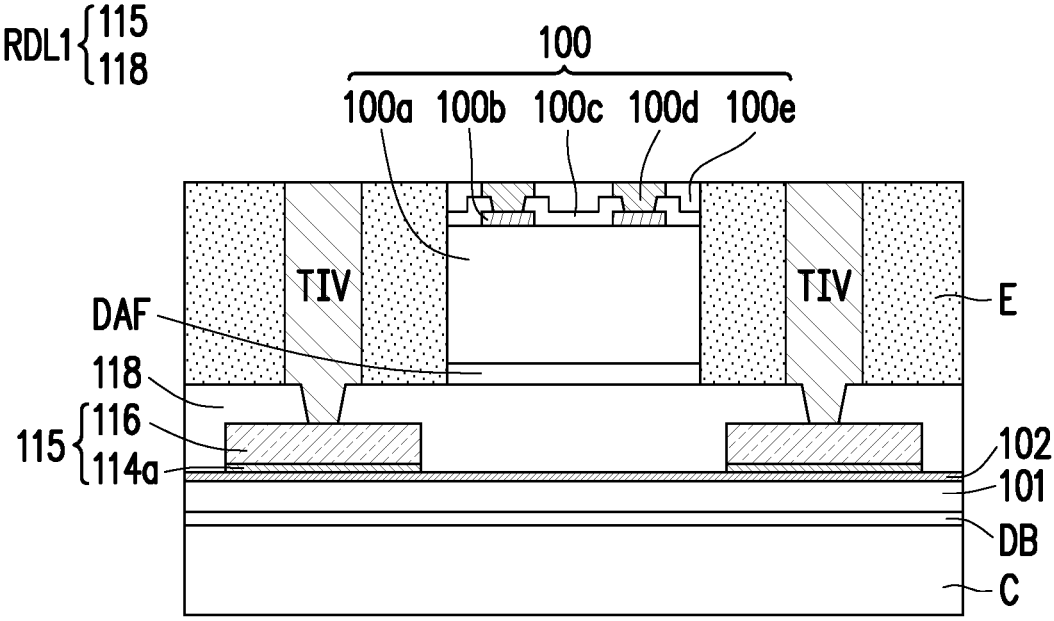

Referring to FIG. 11B, through integrated fan-out vias TIV are formed over and electrically connected to the first redistribution layer 115. Thereafter, a semiconductor chip 100 is picked and placed on the carrier C such that the through integrated fan-out vias TIV are aside or around the semiconductor chip 100. Afterwards, an encapsulant E is formed over the carrier C aside the semiconductor chip 100 and the through integrated fan-out vias TIV.

Figure 11C:
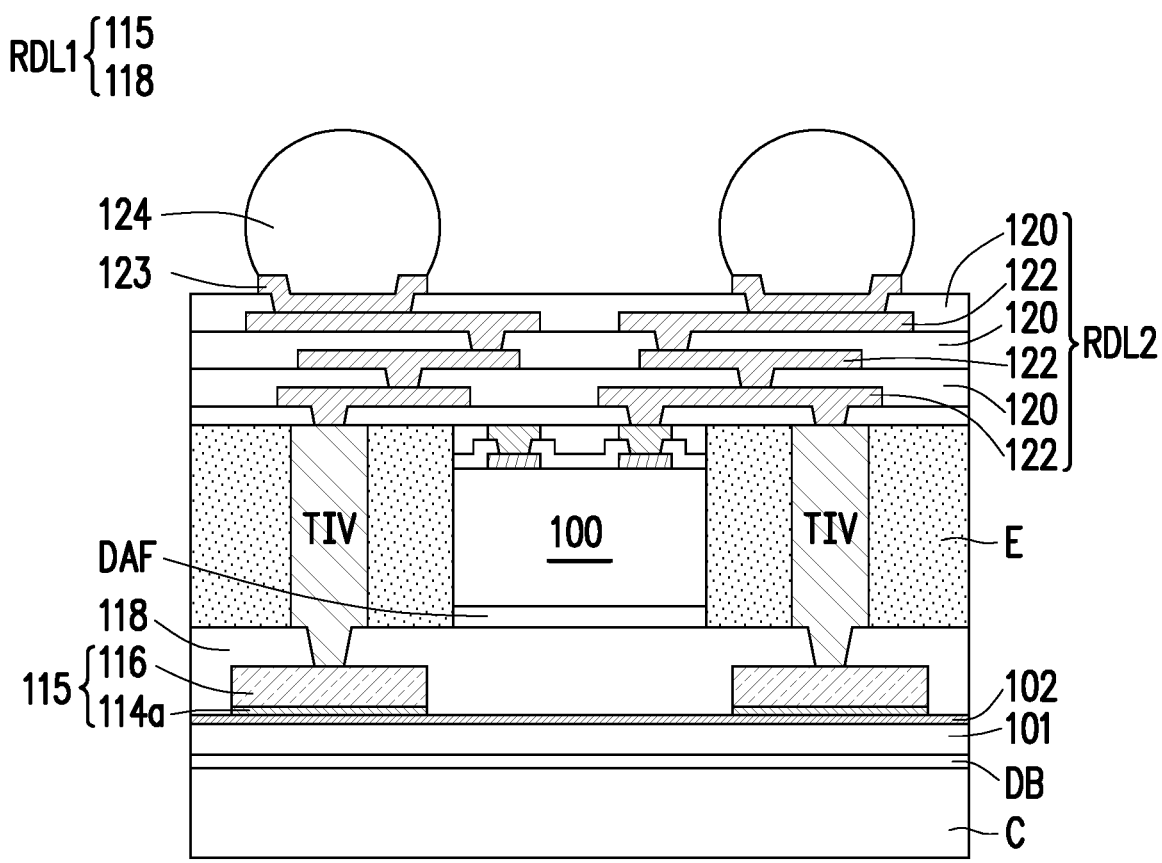

Referring to FIG. 11C, a second redistribution layer structure RDL2 is formed over and electrically connected to the semiconductor chip 100 and the through integrated fan-out vias TIV. In some embodiments, the second redistribution layer structure RDL2 is referred to as a front-side redistribution layer structure throughout the description. In some embodiments, the redistribution layer structure RDL2 includes polymer layers 120 and second redistribution layers 122 stacked alternately. Thereafter, under bump metallization (UBM) pads 123 are formed over and electrically connected to the second redistribution layer structure RDL2. Afterwards, bumps 124 are formed respectively on the UBM pads 123.

Figure 11D:
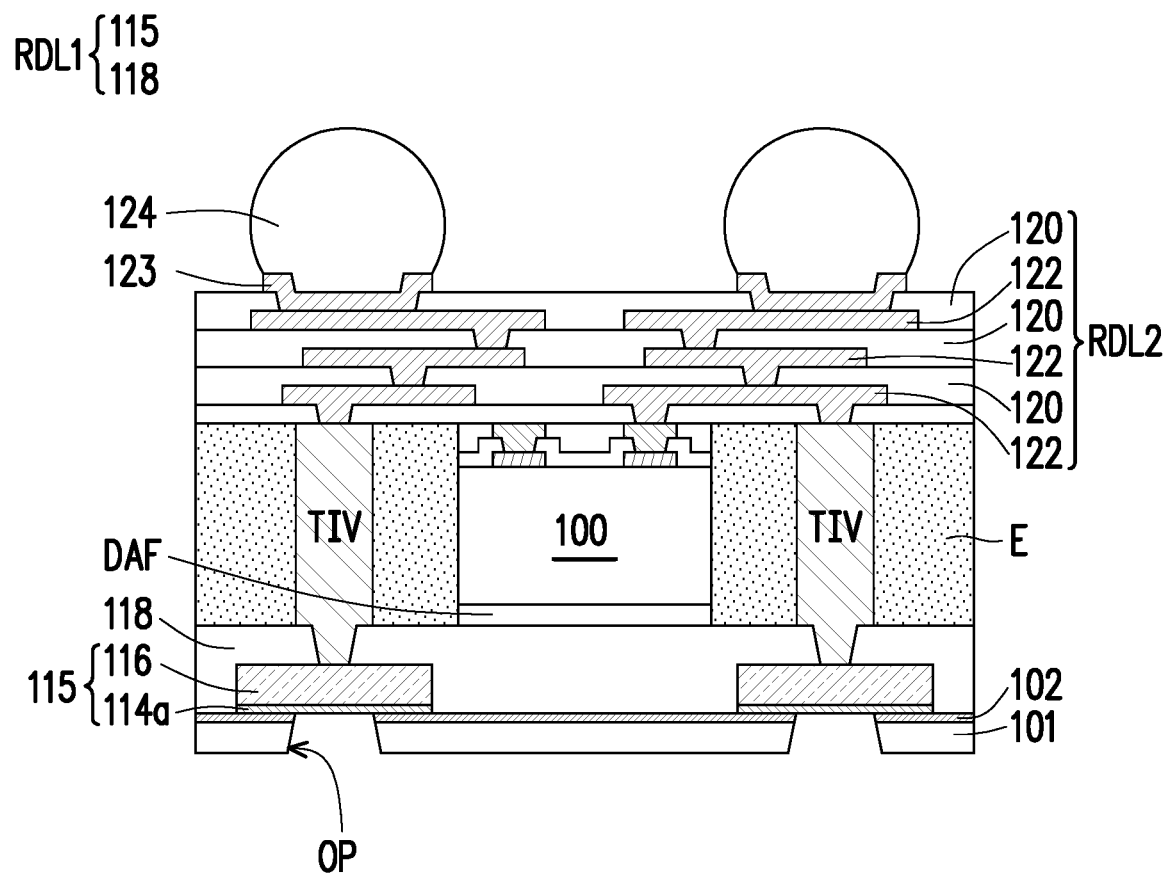

Referring to FIG. 11D, the de-bonding layer DB is decomposed under heat of light, and the carrier C is then de-bonded from the backside of the semiconductor chip 100. Thereafter, the dielectric layer 101 is patterned such that openings OP are formed through the dielectric layer 101. In some embodiments, the openings OP of the dielectric layer 101 are formed by a laser drilling process and then a plasma clean process. In some embodiments, a portion of the barrier layer 102 is simultaneously removed during the pattering operation, so as to expose the bottom surface of the seed layer 114a.

Figure 11E:
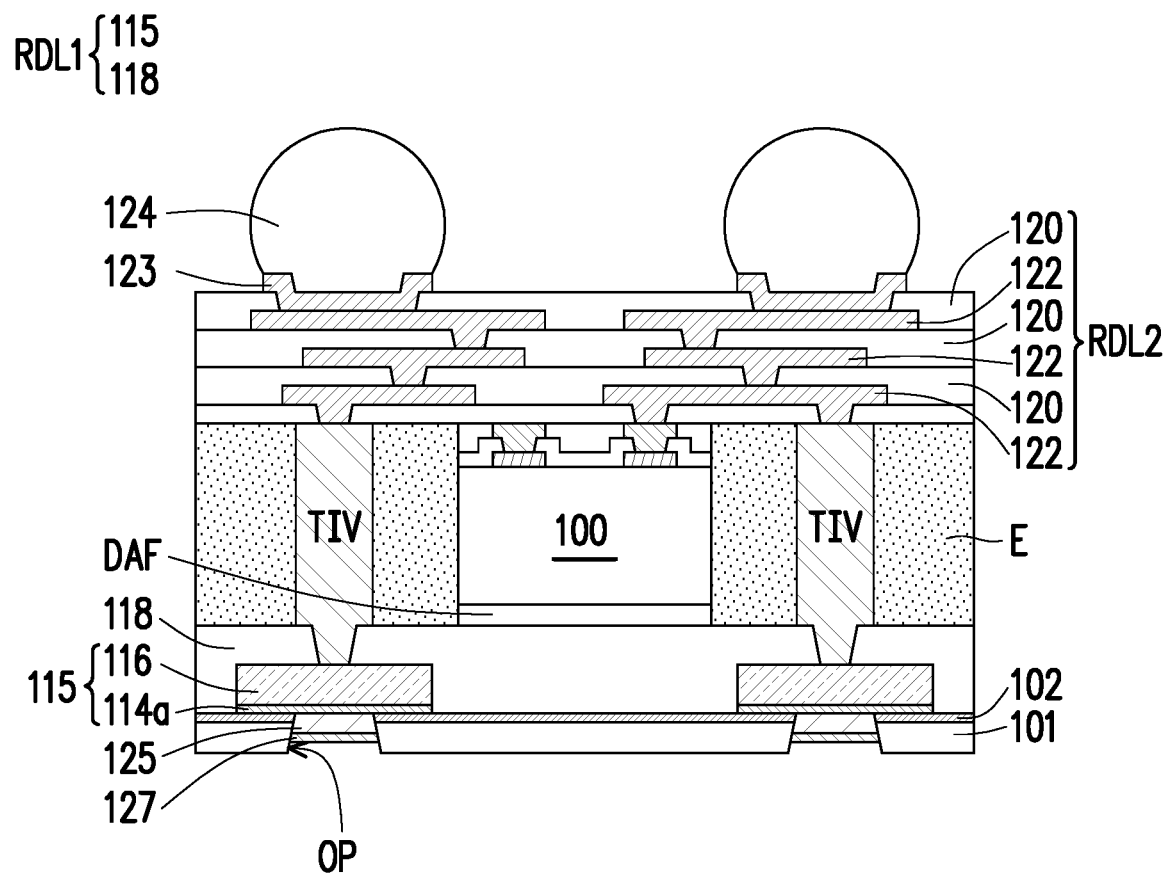
Figure 11F:
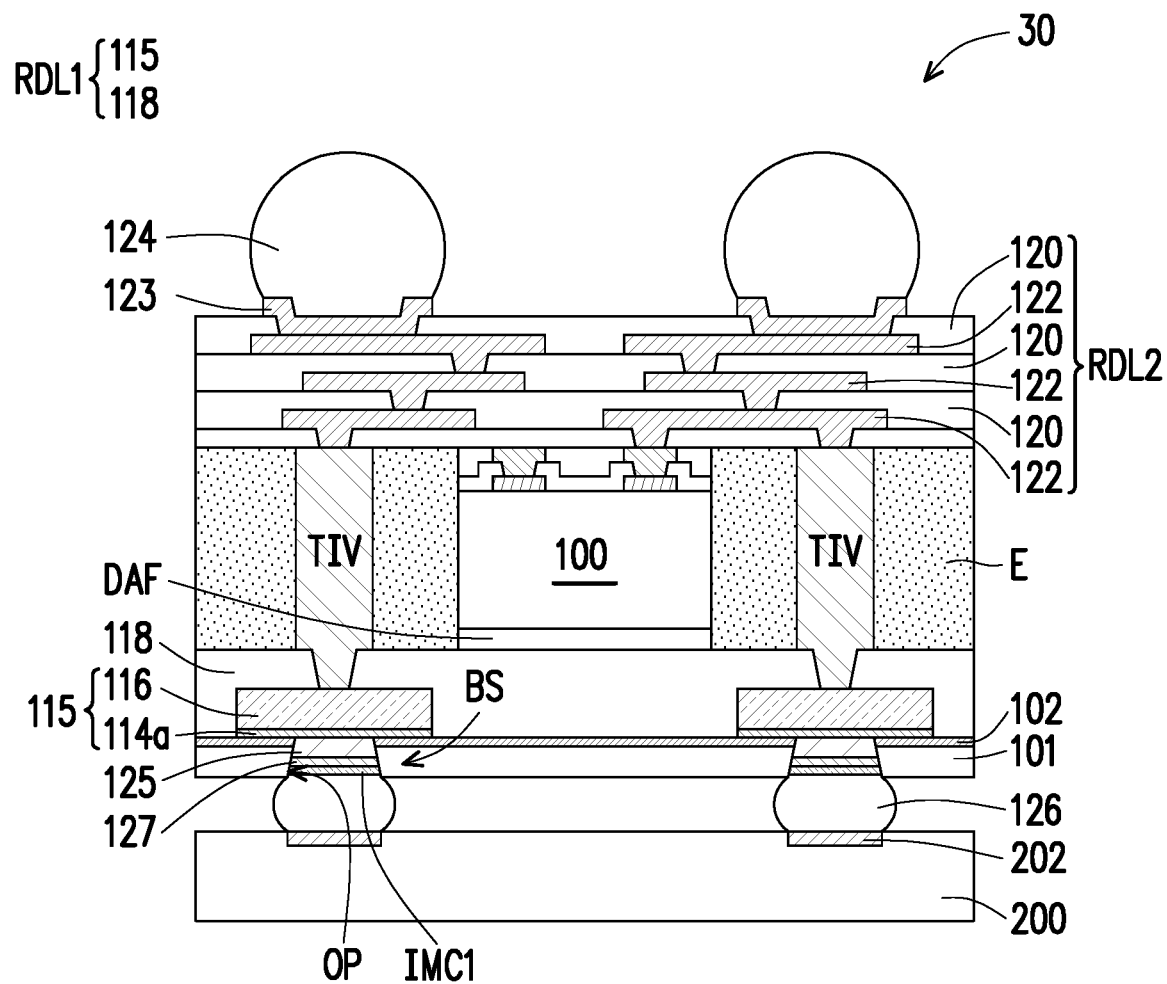

Referring to FIG. 11E, a metal pad 125 and a glue layer 127 are formed in each of the openings OP, and the metal pad 125 is between and in physical contact with the seed layer 114a and the glue layer 127.

In some embodiments, each of the metal pads 125 is made by a single material, such as nickel, copper or a combination thereof, and the glue layer 127 includes gold or an alloy thereof. In some embodiments, the method of forming the metal pads 125 and the glue layer 127 includes performing an electroless plating, such as an Electroless Nickel Immersion Gold (ENIG) process. In some embodiments, the thickness of the nickel layer of each metal pad 125 is about 5 to 40 times (e.g., 30 times) the thickness of the underlying gold glue layer 127.

In alternative embodiments, each of the metal pads 125 is a multi-layer structure including, for example, a metal layer (e.g., nickel layer) and an optional interface layer (e.g., platinum layer), and the interface layer is between and in physical contact with the nickel layer and the subsequently formed solder bump. In such case, the method of forming the metal pads 125 and the glue layer 127 includes performing an electroless plating, such as an Electroless Nickel Electroless Palladium Immersion Gold (ENEPIG) process. In some embodiments, for a multi-layer metal pad 125, the thickness of the nickel layer is about 5 to 40 times (e.g., 30 times) the thickness of the platinum layer. In some embodiments, the thickness of the nickel layer of each metal pad 125 is about 5 to 40 times (e.g., 30 times) the thickness of the underlying gold glue layer 127.

Thereafter, bumps 126 are placed in the openings OP of the dielectric layer 101. In some embodiments, the bumps 126 are solder bumps and can be formed by a suitable process such as evaporation, electroplating, ball drop, or screen printing. During the thermal reflow process of the bump forming operation, intermetallic compound layers IMC1 are respectively formed between glue layers 127 and the bumps 126. In some embodiments, the intermetallic compound layers IMC1 include gold (Au). For example, the intermetallic compound layers IMC1 include an Au—Sn intermetallic compound layer. An integrated fan-out package 30 having dual-side terminals (e.g., bumps 124 and 126) is thus completed.

Afterwards, another package 200 is provided and bonded o the integrated fan-out package 30 through the pads 202 and bumps 126 such that a package-on-package (POP) structure is fabricated.

Although the integrated fan-out package 30 is described above, it will be understood that the disclosure is not limited to the structure since many modifications may be made both in the material and arrangement of elements. Some possible modifications of the structures are described in the following.

Figure 12:
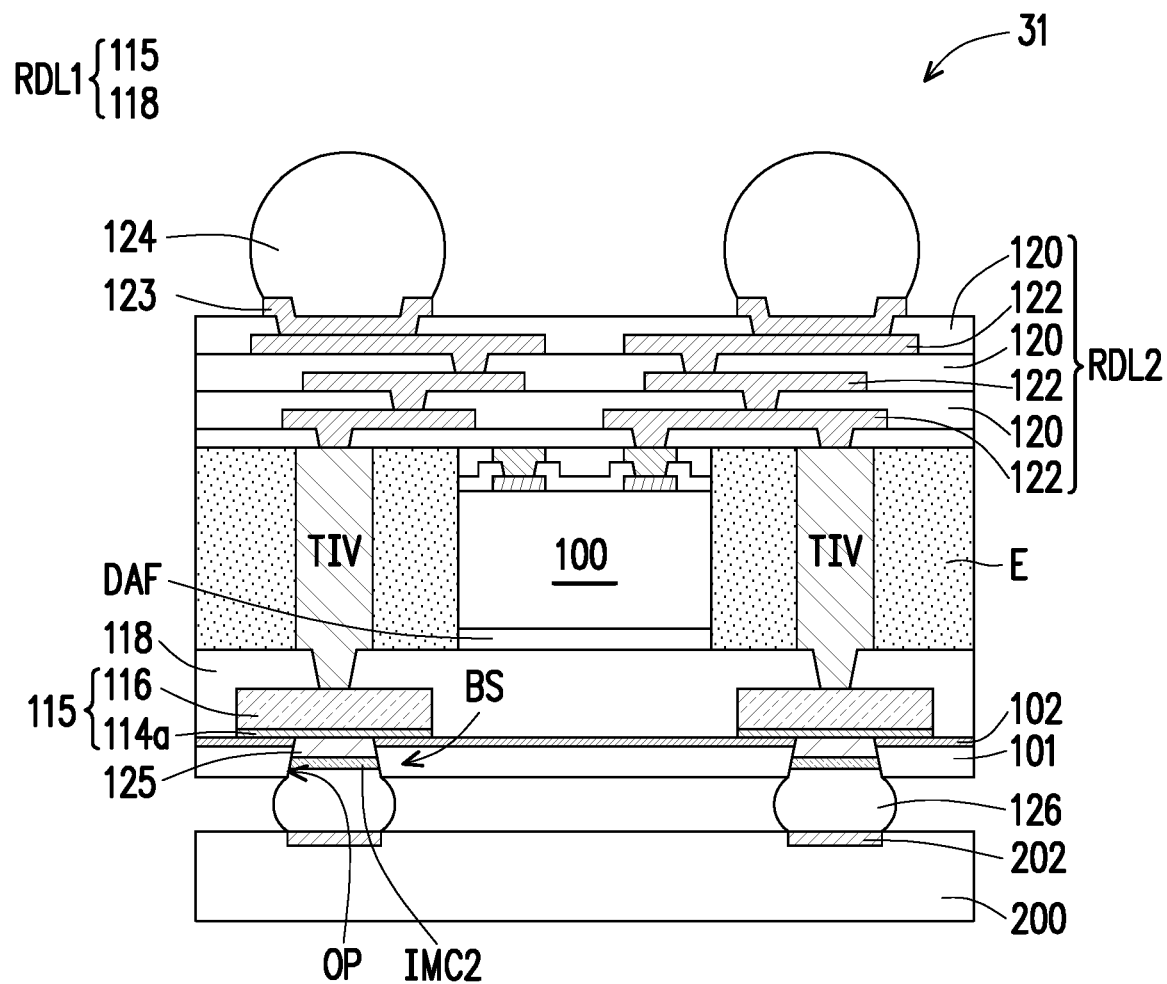
FIG. 12 is a cross-sectional view of an integrated fan-out package in accordance with yet alternative embodiments.

In some embodiments, an integrated fan-out package 30/31 includes a semiconductor chip 100, a bump structure BS and a first redistribution layer 115, as shown in FIG. 11E and FIG. 12. The bump structure BS is electrically connected to the semiconductor chip 100 and includes a solder bump 126, a metal pad 125 (e.g., nickel pad) electrically connected to the solder bump 126, and an intermetallic compound layer IMC1/IMC2 between the solder bump 126 and the metal pad 125. The first redistribution layer 115 is between the bump structure BS and the semiconductor chip 100 and includes a seed layer 114a and a metal layer 116 connected to the seed layer 114a.

In some embodiments, each bump structure BS further includes a glue layer 127, and the glue layer 127 is between the metal pad 125 and the intermetallic compound layer IMC1. In some embodiments, the edge of the glue layer 127 is substantially aligned with the edge of the metal pad 125. In some embodiments, the intermetallic compound layer IMC1 is an Au—Sn intermetallic compound layer.

In some embodiments, a barrier layer 102 is further included and configured to extend from the sidewall of the solder bump 126. In some embodiments, the barrier layer 102 is in physical contact with the seed layer 114a of the first redistribution layer 115, and the barrier layer 102 extends beyond the edge of the first redistribution layer 115.

In some embodiments, the metal pad 125 of the bump structure BS is in physical with the seed layer 114a of the first redistribution layer 115. In some embodiments, the first redistribution layer 115 is in physical contact with the entire top surface of the metal pad 125, as shown in the integrated fan-out package 30 of FIG. 11F.

In some embodiments, as shown in FIG. 12, the solder bump 126 may completely consume the glue layer 127 (e.g., gold layer) and may react with gold and nickel to form an intermetallic compound layer IMC2 between the solder bump 126 and metal pad 125. In some embodiments, the intermetallic compound layer IMC2 is a Ni—Au—Sn intermetallic compound layer.

In view of the above, a metal pad (e.g., Cu/Ni/Au or Ni/Au stack) is introduced between the solder bump and the backside redistribution layer, so the backside redistribution layer is not consumed by the solder bump, such as generation of the intermetallic compound (IMC), and thus, the reliability of the package is improved. With the method of disclosure, the conventional solder paste or flux is not required for forming the bump structure, so the queue time (Q-time) can be prolonged to allow greater flexibility in the production flow.

In accordance with some embodiments of the present disclosure, an integrated fan-out package includes a bump structure, a polymer layer and a metal layer. The bump structure includes a metal pad and a bump electrically connected to the metal pad. The polymer layer extends laterally from a sidewall of the bump. The metal layer is over the bump structure and in physical contact with a side surface of the metal pad.

In accordance with alternative embodiments of the present disclosure, an integrated fan-out package includes a semiconductor chip, a bump structure and a first redistribution layer. The bump structure is electrically connected to the semiconductor chip and includes a solder bump, a nickel pad electrically connected to the solder bump, and an intermetallic compound layer between the solder bump and the nickel pad. In some embodiments, the intermetallic compound layer includes gold (Au). The first redistribution layer is between the bump structure and the semiconductor chip.

In accordance with yet alternative embodiments of the present disclosure, a method of forming an integrated fan-out package includes the following operations. A carrier is provided with a polymer layer and a glue layer formed thereon. A plurality of metal pads is plated on the carrier by using the glue layer as a seed layer. A first redistribution layer is plated on the metal pads by using the glue layer as a seed layer. The carrier is removed. A plurality of bumps is formed through the polymer layer and electrically connected to the metal pads.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
   a bump structure comprising:
      a metal pad; and
      a bump electrically connected to the metal pad;
   a dielectric layer extending laterally from a sidewall of the bump; and
   a redistribution layer comprising a metal line and a polymer layer encapsulating the metal line, wherein the metal pad is disposed between the metal line and the metal bump, and the metal line is in physical contact with a side surface of the metal pad.

2. The integrated fan-out package of claim 1, wherein the metal line encapsulates the entire side surface and a top surface of the metal pad.

3. The integrated fan-out package of claim 1, wherein the bump structure further comprises an intermetallic compound layer between the metal pad and the bump, and the intermetallic compound layer comprises gold (Au).

4. The integrated fan-out package of claim 1, wherein the bump structure further comprises an intermetallic compound layer that is between the metal pad and the bump and in physical contact with the metal line.

5. The integrated fan-out package of claim 1, wherein the bump structure further comprises an intermetallic compound layer that is between the metal pad and the bump and extends laterally away from the bump.

6. The integrated fan-out package of claim 3, further comprising a barrier layer vertically between the intermetallic compound layer and the dielectric layer.

7. The integrated fan-out package of claim 1, wherein the metal pad comprises nickel, copper or a combination thereof, and a thickness of the metal layer of the redistribution layer is about 0.5 to 5 times a thickness of the metal pad.

8. The integrated fan-out package of claim 3, wherein the intermetallic compound layer is thicker between the metal pad and the bump while thinner between the dielectric layer and the metal line.

9. The integrated fan-out package of claim 1, further comprising a through integrated fan-out via electrically connected to the metal line.

10. A method of forming an integrated fan-out package, comprising:
    providing a carrier having a dielectric layer and a glue layer formed thereon;
    plating a plurality of metal pads on the carrier by using the glue layer as a seed layer;
    plating metal lines respectively on the metal pads by using the glue layer as a seed layer, wherein the each of the metal lines is in physical contact with an entire side surface of the corresponding metal pad;
    forming a polymer layer encapsulating the metal lines;
    removing the carrier; and
    forming a plurality of bumps through the polymer layer and electrically connected to the metal pads.

11. The method of claim 10, further comprising, after forming the polymer layer and before removing the carrier:
    forming a plurality of integrated fan-out through vias electrically connected to the metal pads;
    placing a semiconductor chip on the carrier aside the integrated fan-out through vias; and
    forming a second redistribution layer structure over the semiconductor chip.

12. The method of claim 10, further comprising forming a barrier layer between the glue layer and the dielectric layer.

13. An integrated fan-out package, comprising:
    a semiconductor chip;
    a first redistribution layer structure located at a back side of the semiconductor chip; and
    a second redistribution layer structure located at a front side of the semiconductor chip,
    wherein the first redistribution layer structure comprises a metal pad, a metal layer and a polymer layer, the metal layer is in physical contact with an entire side surface of the metal pad, and the polymer layer encapsulates the metal layer.

14. The integrated fan-out package of claim 13, wherein the metal layer encapsulates the side surface and a top surface of the metal pad.

15. The integrated fan-out package of claim 13, further comprising:
    a bump located at the back side of the semiconductor chip and electrically connected to the first redistribution layer structure; and
    an intermetallic compound layer located between the metal pad and the bump, wherein the intermetallic compound layer comprises gold (Au).

16. The integrated fan-out package of claim 15, wherein the intermetallic compound layer comprises is an Au—Sn intermetallic compound layer, a Ni—Au—Sn intermetallic compound layer, a Cu—Au—Sn intermetallic compound layer or a combination thereof.

17. The integrated fan-out package of claim 15, wherein the intermetallic compound layer further extends laterally away from the bump.

18. The integrated fan-out package of claim 15, wherein an edge of the intermetallic compound layer is substantially aligned with an edge of the metal layer.

19. The integrated fan-out package of claim 15, wherein the intermetallic compound layer has a non-uniform thickness.

20. The integrated fan-out package of claim 15, further comprising a barrier layer extending laterally from a sidewall of the bump and in physical contact with the intermetallic compound layer.

* * * * *